United States Patent
Noh et al.

(10) Patent No.: US 12,069,860 B2
(45) Date of Patent: Aug. 20, 2024

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Yoo Hyun Noh, Icheon-si (KR); Da Yung Byun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 9 days.

(21) Appl. No.: 18/110,604

(22) Filed: Feb. 16, 2023

(65) Prior Publication Data
US 2023/0200064 A1    Jun. 22, 2023

Related U.S. Application Data

(63) Continuation of application No. 17/062,223, filed on Oct. 2, 2020, now Pat. No. 11,610,913.

(30) Foreign Application Priority Data

May 7, 2020 (KR) .......................... 10-2020-0054722

(51) Int. Cl.
*H10B 43/20* (2023.01)
*H01L 23/522* (2006.01)
(Continued)

(52) U.S. Cl.
CPC ......... *H10B 43/20* (2023.02); *H01L 23/5226* (2013.01); *H10B 41/20* (2023.02); *H10B 41/40* (2023.02); *H10B 43/40* (2023.02)

(58) Field of Classification Search
CPC ........ H10B 43/20; H10B 41/20; H10B 41/40; H10B 43/40; H10B 41/27; H10B 43/27;
(Continued)

(56) References Cited

U.S. PATENT DOCUMENTS

2013/0334589 A1   12/2013  Ahn
2015/0162342 A1    6/2015  Lee et al.
(Continued)

FOREIGN PATENT DOCUMENTS

CN        105374795 A    3/2016
CN        105977257 A    9/2016
(Continued)

*Primary Examiner* — Thanhha S Pham
(74) *Attorney, Agent, or Firm* — WILLIAM PARK & ASSOCIATES LTD.

(57) ABSTRACT

A semiconductor device includes a stacked structure including a first region in which conductive layers and the insulating layers are stacked alternately with each other, and a second region in which sacrificial layers and the insulating layers are stacked alternately with each other, a first slit structure located at a boundary between the first region and the second region and including a first through portion passing through the stacked structure and first protrusions extending from a sidewall of the first through portion, a second slit structure located at the boundary and including a second through portion passing through the stacked structure and second protrusions extending from a sidewall of the second through portion and coupled to the first protrusions, a circuit located under the stacked structure, and a contact plug passing through the second region of the stacked structure and electrically connected to the circuit.

9 Claims, 49 Drawing Sheets

(51) Int. Cl.
*H10B 41/20* (2023.01)
*H10B 41/40* (2023.01)
*H10B 43/40* (2023.01)

(58) Field of Classification Search
CPC ........ H10B 43/50; H10B 41/50; H10B 63/84; H10B 41/10; H10B 41/35; H10B 41/41; H10B 43/10; H10B 43/35; H10B 51/00; H01L 23/5226; H01L 21/76897; H01L 23/5386; H01L 21/76802
See application file for complete search history.

(56) References Cited

U.S. PATENT DOCUMENTS

| | | | |
|---|---|---|---|
| 2018/0294274 A1 | 10/2018 | Lee et al. | |
| 2020/0286530 A1 | 9/2020 | Lee et al. | |
| 2021/0082941 A1* | 3/2021 | Son | H01L 23/528 |

FOREIGN PATENT DOCUMENTS

| | | | |
|---|---|---|---|
| CN | 106409837 A | 2/2017 | |
| CN | 108063142 A | 5/2018 | |
| CN | 109346469 A | 2/2019 | |
| CN | 110767657 A | 2/2020 | |
| KR | 1020130084434 A | 7/2013 | |
| KR | 1020190024579 A | 3/2019 | |
| KR | 1020190026418 A | 3/2019 | |
| KR | 1020200011852 A | 2/2020 | |
| WO | 2020005335 A1 | 1/2020 | |

\* cited by examiner

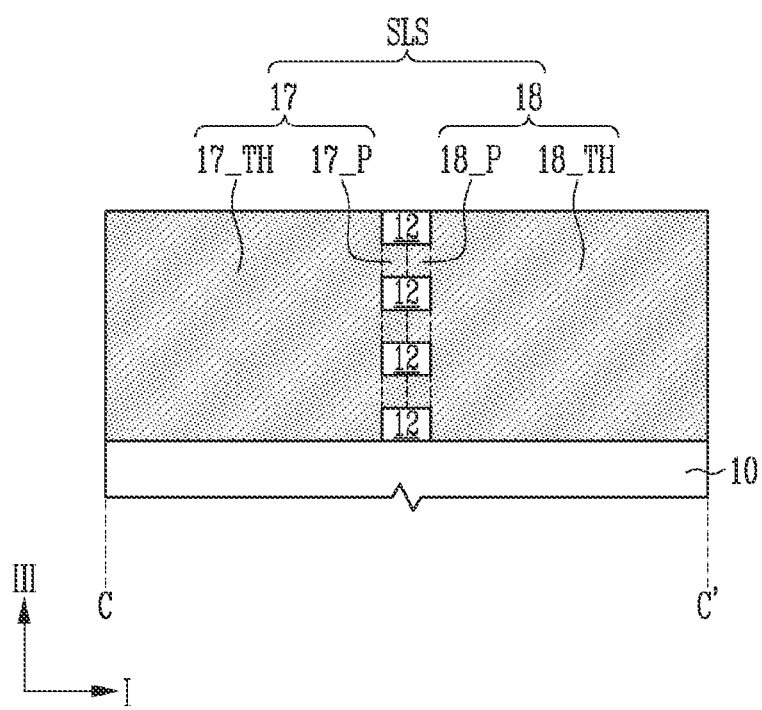

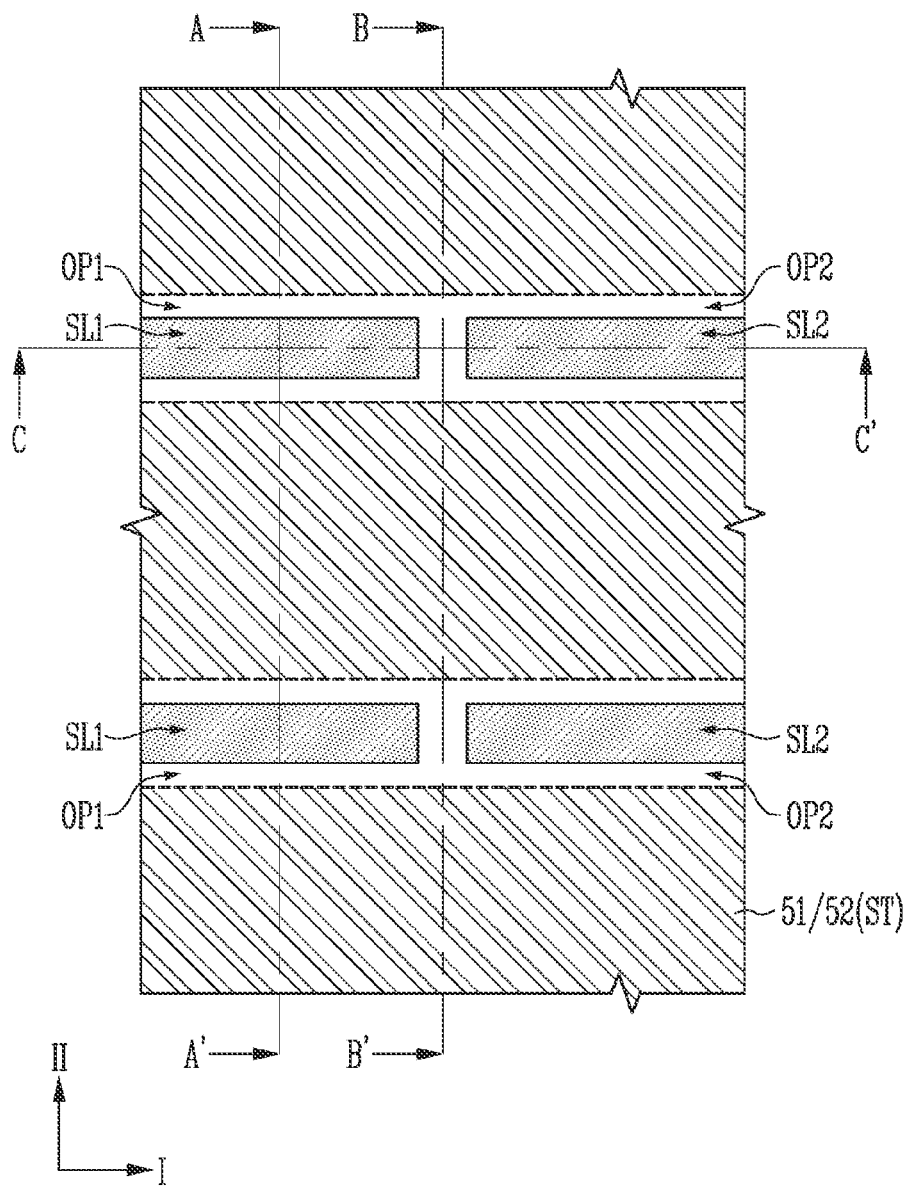

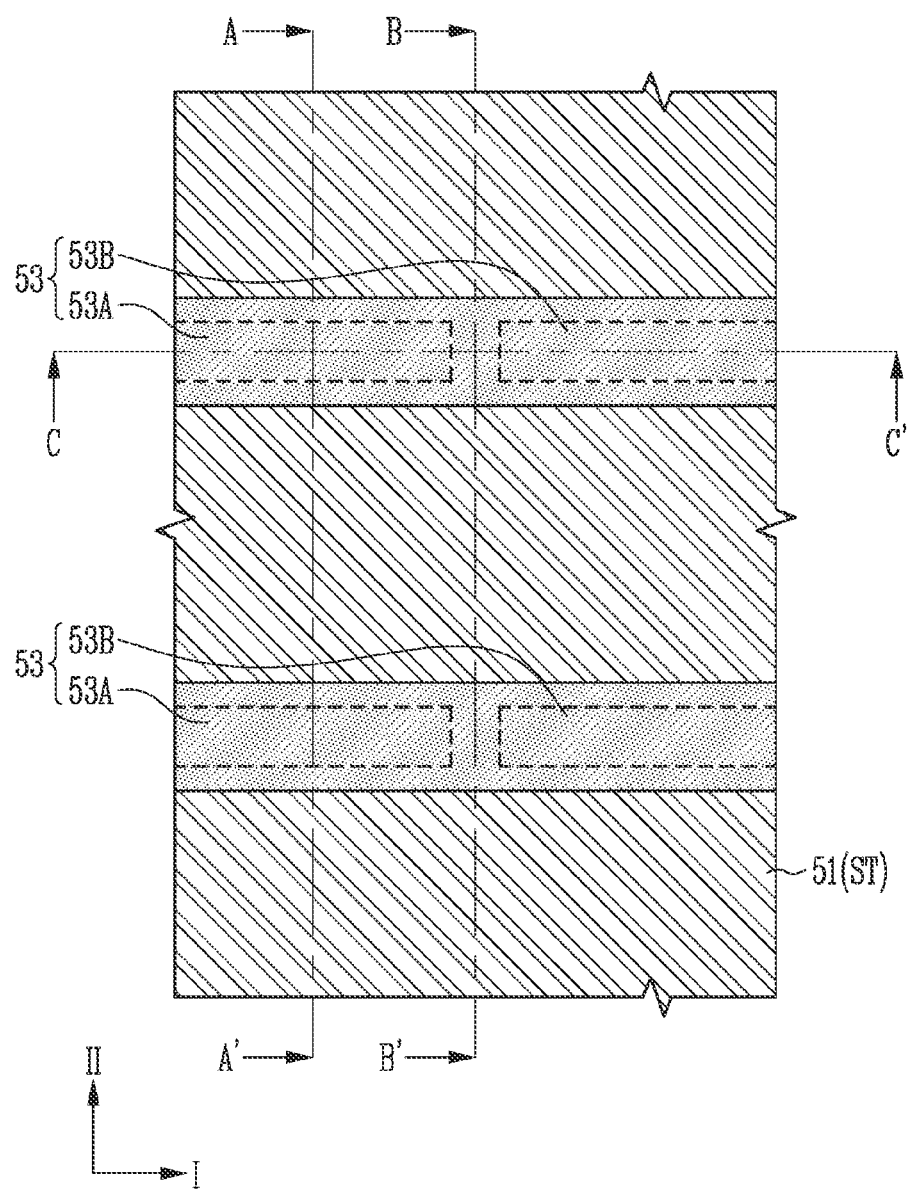

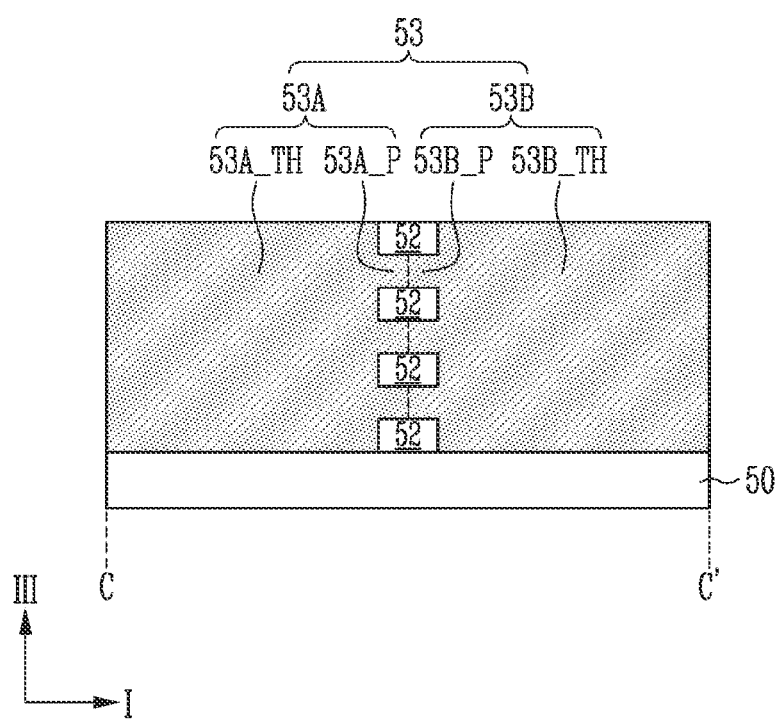

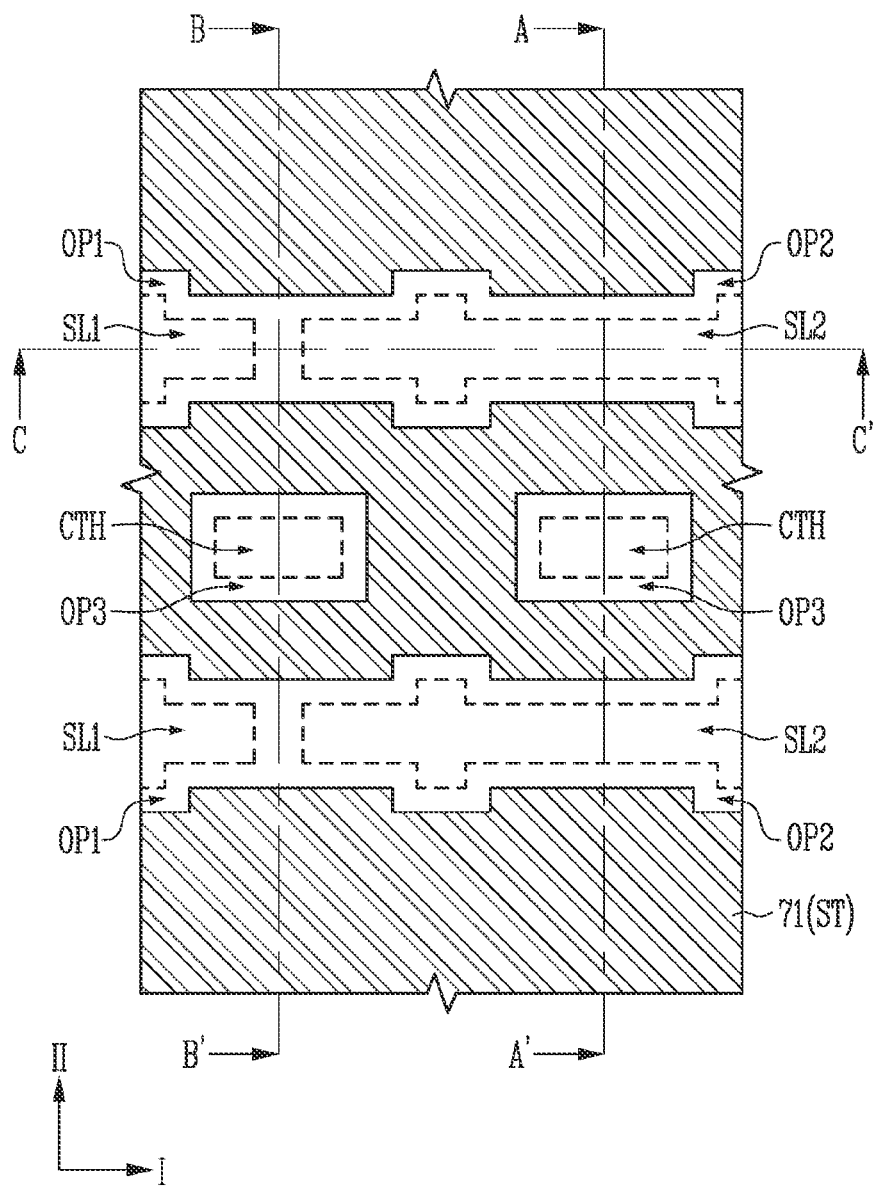

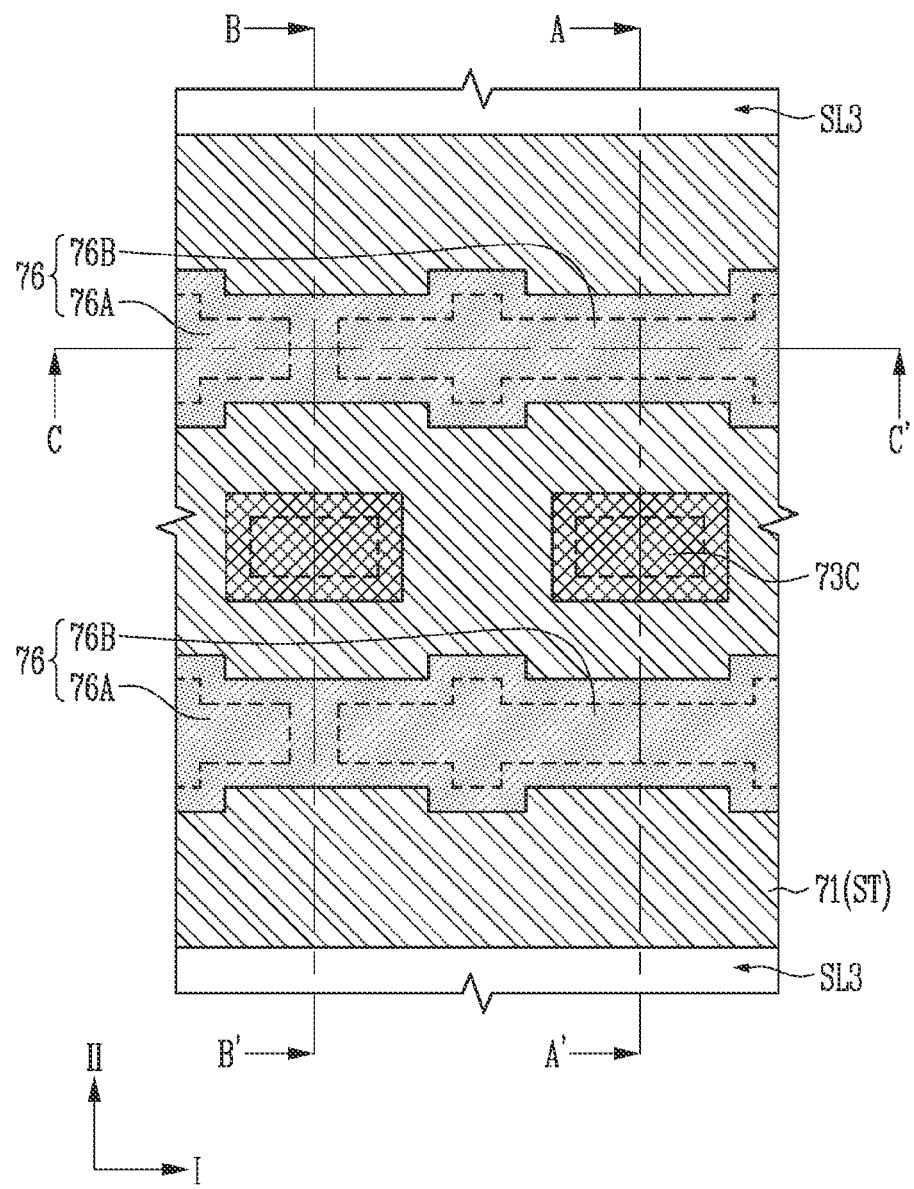

SEMICONDUCTOR DEVICE AND MANUFACTURING METHOD OF SEMICONDUCTOR DEVICE

CROSS-REFERENCE TO RELATED APPLICATION

The present application is a continuation application of U.S. patent application Ser. No. 17/062,223, filed on Oct. 2, 2020, and claims priority under 35 U.S.C. § 119(a) to Korean patent application number 10-2020-0054722 filed on May 7, 2020, in the Korean Intellectual Property Office, the entire disclosure of which is incorporated by reference herein.

BACKGROUND

1. Technical Field

Various embodiments relate to an electronic device, and more particularly, to a semiconductor device and a manufacturing method of the semiconductor device.

2. Related Art

Non-volatile memory devices retain stored data regardless of power on/off conditions. The increase in integration density of two-dimensional non-volatile memory devices in which memory cells are formed in a single layer over a substrate has recently been limited. Thus, three-dimensional non-volatile memory devices have been proposed in which memory cells are stacked in a vertical direction over a substrate.

A three-dimensional non-volatile memory device may include interlayer insulating layers and gate electrodes that are stacked alternately with each other, and channel layers passing therethrough, with memory cells stacked along the channel layers. Various structures and manufacturing methods have been developed to improve the operational reliability of three-dimensional non-volatile memory devices.

SUMMARY

According to an embodiment, A semiconductor device may include a stacked structure including insulating layers stacked on each other, the stacked structure including a first region in which conductive layers and the insulating layers are stacked alternately with each other, and a second region in which sacrificial layers and the insulating layers are stacked alternately with each other, a first slit structure located at a boundary between the first region and the second region and including a first through portion passing through the stacked structure and first protrusions extending from a sidewall of the first through portion, a second slit structure located at the boundary and including a second through portion passing through the stacked structure and second protrusions extending from a sidewall of the second through portion and coupled to the first protrusions, a circuit located under the stacked structure, and a contact plug passing through the second region of the stacked structure and electrically connected to the circuit.

A semiconductor device may include a stacked structure including insulating layers stacked on each other, the stacked structure including a first region in which conductive layers and the insulating layers are stacked alternately with each other, and a second region in which sacrificial layers and the insulating layers are stacked alternately with each other, a slit insulating layer located at a boundary between the first region and the second region and including through portions passing through the stacked structure and protrusions coupling the through portions to each other, a circuit located under the stacked structure, and a contact plug passing through the second region of the stacked structure and electrically connected to the circuit, wherein each of the insulating layers passes through the slit insulating layer to support the slit insulating layer between the protrusions.

A method of manufacturing a semiconductor device may include forming a stacked structure including sacrificial layers and insulating layers stacked alternately with each other, forming a first slit passing through the stacked structure, forming a second slit passing through the stacked structure and spaced apart from the first slit, forming first openings coupling the first slit and the second slit to each other by etching sacrificial layers exposed through the first slit and the second slit, forming a slit structure in the first slit, the second slit and the first openings, forming second openings by selectively removing the sacrificial layers located at one side of the slit structure, and forming conductive layers in the second openings.

BRIEF DESCRIPTION OF THE DRAWINGS

FIGS. 2A, 2B, 2C, 2D, and 2E are diagrams illustrating the structure of a semiconductor device according to an embodiment of the present disclosure;

FIGS. 6A, 6B, 6C, and 6D, FIGS. 7A, 7B, 7C, and 7D, FIGS. 8A, 8B, 8C, and 8D, FIGS. 9A, 9B, 9C, and 9D, and FIGS. 10A, 10B, 10C, and 10D are diagrams illustrating a manufacturing method of a semiconductor device according to an embodiment of the present disclosure;

FIGS. 11A, 11B, 11C, and 11D, FIGS. 12A, 12B, 12C, and 12D, FIGS. 13A, 13B, 13C, and 13D, FIGS. 14A, 14B, 14C, and 14D, FIGS. 15A, 15B, 15C, and 15D, and FIGS. 16A, 16B, 16C, and 16D are diagrams illustrating a manufacturing method of a semiconductor device according to an embodiment of the present disclosure;

DETAILED DESCRIPTION

Figure 1:
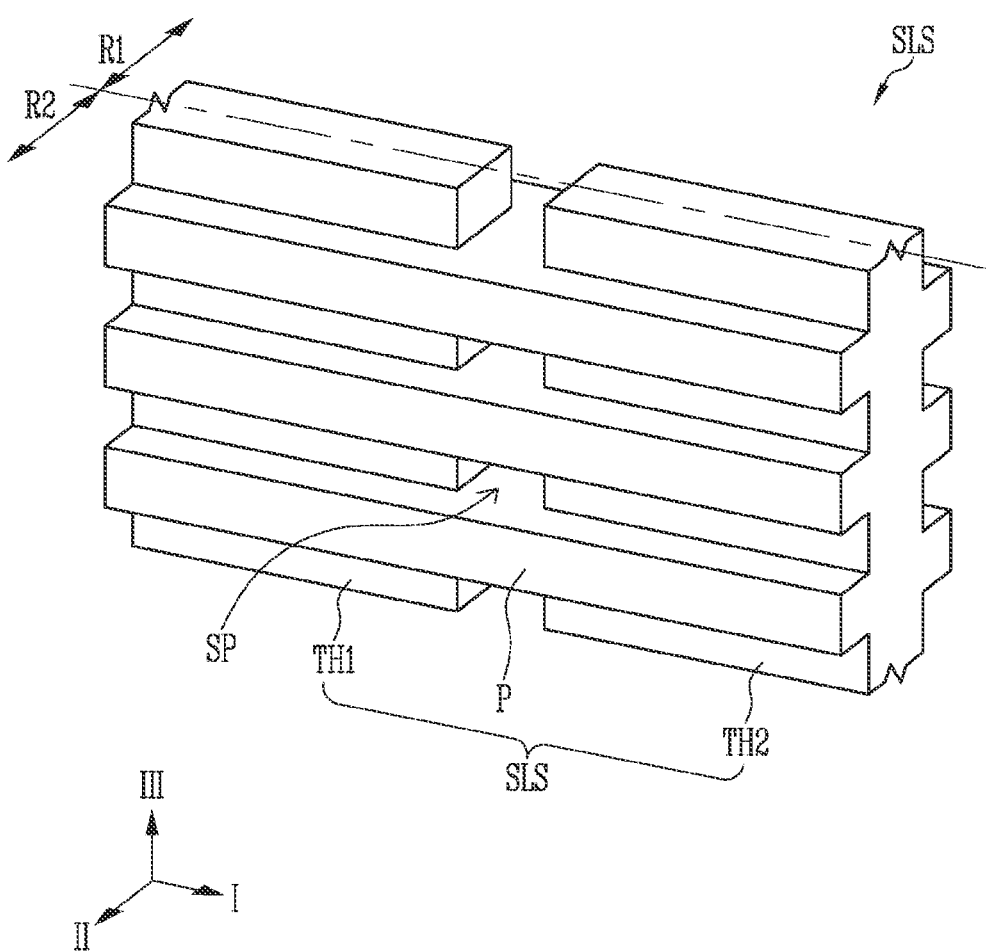
FIG. 1 is a diagram illustrating the structure of a semiconductor device according to an embodiment of the present disclosure.

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases that the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween. Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing. In the description of the following embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

Various embodiments of the present disclosure provide a semiconductor device having a stabilized structure and improved characteristics, and a manufacturing method of the semiconductor device.

FIG. 1 is a diagram illustrating the structure of a semiconductor device. More specifically, FIG. 1 is a perspective view showing a slit structure SLS according to an embodiment of the present disclosure.

Referring to FIG. 1, the slit structure SLS may be an isolation structure for separating a first region R1 from a second region R2. The first region R1 may be located at one side of the slit structure SLS and the second region R2 may be located at another side of the slit structure SLS. The first region R1 and the second region R2 may be adjacent to each other in a second direction II with the slit structure SLS interposed therebetween. The second direction II may cross a first direction I. The slit structure SLS may include an insulating material and be a slit insulating layer.

The slit structure SLS may include through portions TH1 and TH2 and protrusions P. The through portions TH1 and TH2 and the protrusions P may be coupled integrally with each other to form a single layer. The through portions TH1 and TH2 may extend in a third direction III. The third direction III may cross the first direction I and the second direction II. The third direction III may protrude from the plane defined by the first direction I and the second direction II. The first through portion TH1 and the second through portion TH2 may neighbor each other in the first direction I and be spaced apart from each other.

The protrusions P may protrude from sidewalls of the through portion TH1 and TH2. The first through portion TH1 and the second through portion TH2 may be coupled to each other by the protrusions P. The protrusions P may be separated from each other in the third direction III. Therefore, the protrusions P may couple the first through portion TH1 and the second through portion TH2 to each other at predetermined levels.

According to the above-described structure, the first region R1 and the second region R2 may be separated from each other by the slit structure SLS. Further, the first and second regions R1 and R2 may be selectively separated from each other at predetermined levels only in the third direction III. The first region R1 and the second region R2 may be separated from each other at predetermined levels corresponding to the protrusions P, and the first region R1 and the second region R2 may be coupled to each other in the remaining levels.

In addition, the slit structure SLS may have a high aspect ratio so that a height of the slit structure SLS in the third direction III is greater than the area defined by the first direction I and the second direction II. However, the structure with the high aspect ratio may be likely bent, leaned, or cracked due to stress applied to the first region R1 or the second region R2 in the second direction II. Therefore, in order to reduce deformation caused by stress, the slit structure SLS may include the through portions TH1 and TH2 and the protrusions P. A space SP may exist between the first through portion TH1 and the second through portion TH2, or between the protrusions P. The first region R1 and the second region R2 may be coupled to each other through the space SP. Therefore, the slit structure SLS may be supported by a material filling the space SP, so that the slit structure SLS may have structural stability.

In an embodiment, the slit structure SLS may include a plane having a linear shape extending in the first direction I. However, the present disclosure is not limited thereto. For example, the plane of the slit structure SLS may have a closed curved shape such as a circle, an ellipse, a rectangle, or a polygon. In addition, the inside and outside of the closed curved shape may be separated from each other by the slit structure SLS.

Figure 2A:
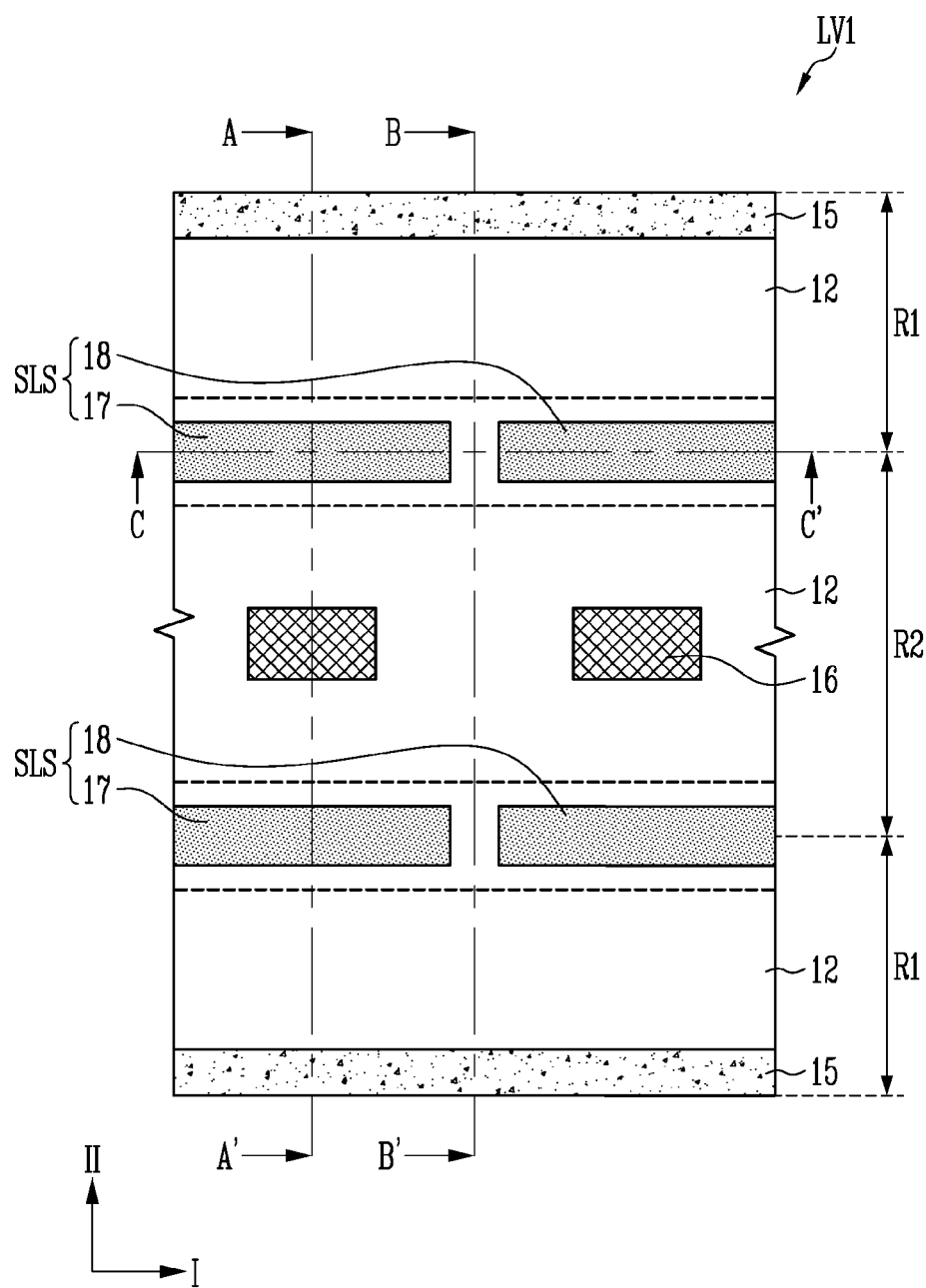
Figure 2B:
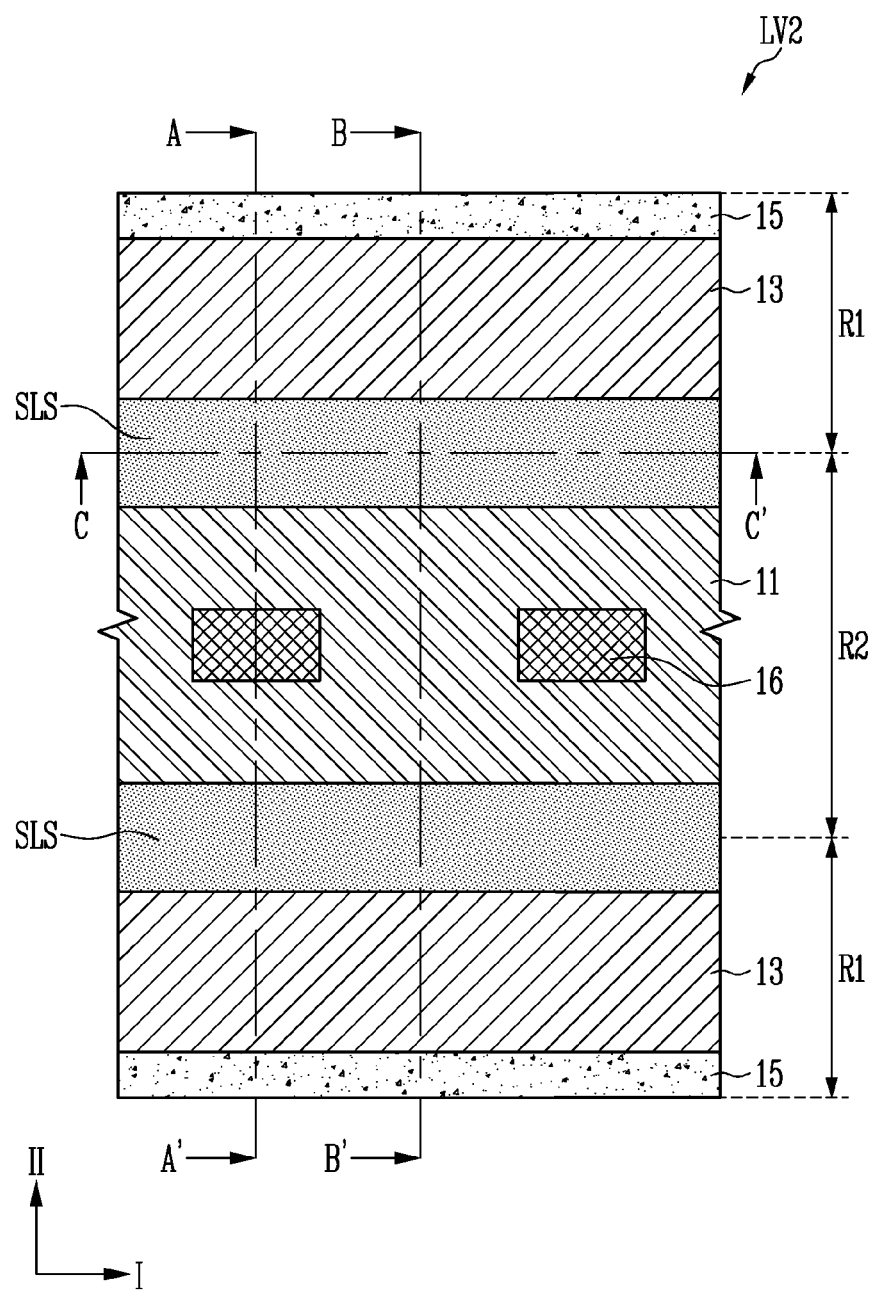
Figure 2C:
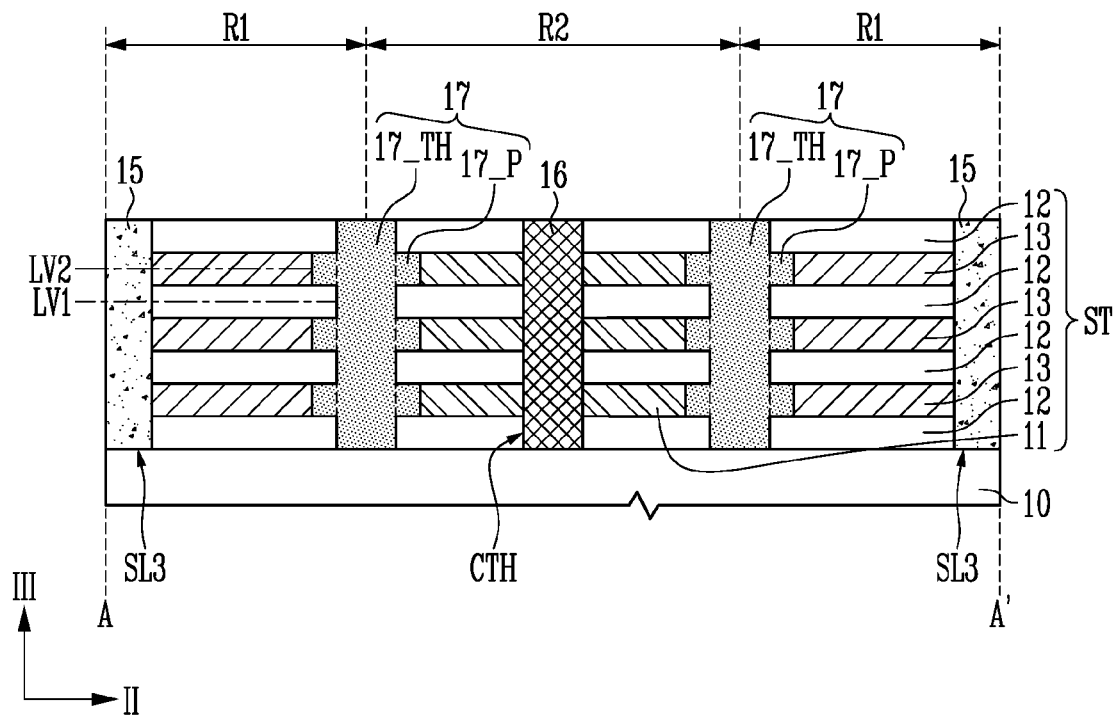
Figure 2D:
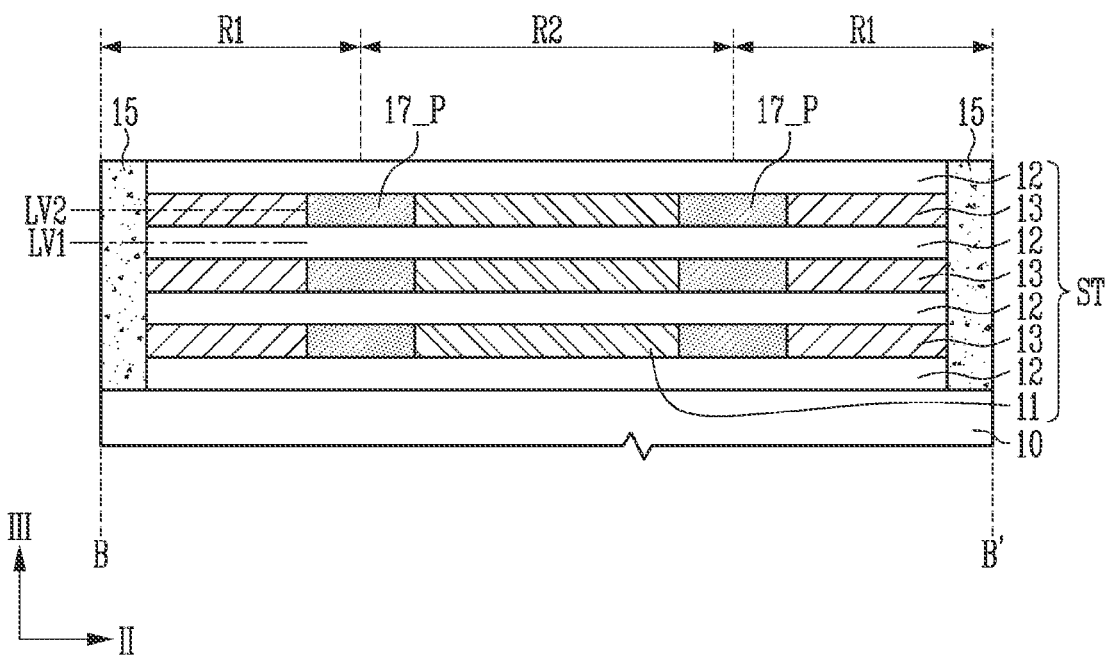

FIGS. 2A to 2E are diagrams illustrating the structure of a semiconductor device according to an embodiment of the present disclosure. FIG. 2A is a plan view of a first level LV1 and FIG. 2B is a plan view of a second level LV2. FIG. 2C is a cross-sectional view along A-A', FIG. 2D is a cross-sectional view along B-B', and FIG. 2E is a cross-sectional view along C-C'. In the following description, description of certain elements that are discussed above is omitted for the sake of brevity.

Referring to FIGS. 2A to 2E, a semiconductor device may include a stacked structure ST, the slit structure SLS and a contact plug 16. In addition, the semiconductor device may further include a source layer 10, a third slit structure 15, and the like. The slit structure SLS may include a first slit structure 17 and a second slit structure 18. The source layer 10 may be located under the stacked structure ST. The source layer 10 may include a conductive material such as polysilicon, tungsten, metal or the like.

The stacked structure ST may include insulating layers 12 stacked on each other. In addition, the stacked structure ST may include sacrificial layers 11 and conductive layers 13 interposed between the insulating layers 12.

The sacrificial layers 11 may remain without being replaced by the conductive layers 13 during manufacturing processes. The sacrificial layers 11 may include a material having a high etch selectivity with respect to the insulating layers 12. For example, the sacrificial layers 11 may include an insulating material such as oxides or nitrides. The conductive layers 13 may be gate electrodes of a select transistor, memory cells, and the like. The conductive layers 13 may include a conductive material such as polysilicon, tungsten, metal or the like. The insulating layers 12 may be provided to insulate the stacked conductive layers 13 from each other. The insulating layers 12 may include an insulating material such as oxides and nitrides.

The stacked structure ST may include the first region R1 and the second region R2. The first region R1 in the stacked structure ST may refer to a portion where the conductive layers 13 and the insulating layers 12 of the stacked structure ST are stacked alternately with each other. The second region R2 in the stacked structure ST may refer to a portion where the sacrificial layers 11 and the insulating layers 12 are stacked alternately with each other. The first region R1 and the second region R2 may be adjacent to each other in the second direction II. The first region R1, the second region R2 and the first region R1 may be sequentially defined in the second direction II. The slit structure SLS may be located at the boundary between the first region R1 and the second region R2. The first region R1 may be one side of the slit structure SLS and the second region R2 may be another side of the slit structure SLS. In an embodiment, the first slit structure 17 and the second slit structure 18 may be located at a boundary between the first and second regions R1 and R2.

Though not shown in FIGS. 2A to 2E, the stacked structure ST may include a pad structure for exposing the conductive layers 13. For example, a portion of the stacked structure ST may have a stepped structure.

The first slit structure 17 may include a first through portion 17_TH and first protrusions 17_P. The first through portion 17_TH may pass through the stacked structure ST in the third direction III. The first protrusions 17_P may protrude from a sidewall of the first through portion 17_TH. The first protrusions 17_P may be located at levels corresponding to the conductive layers 13 and the sacrificial layers 11. The first protrusions 17_P may protrude between the insulating layers 12 and may protrude in the first direction I or the second direction II.

The second slit structure 18 may include a second through portion 18_TH and second protrusions 18_P. The second through portion 18_TH may pass through the stacked structure ST in the third direction III. The second protrusions 18_P may protrude from a sidewall of the second through portion 18_TH. The second protrusions 18_P may be located at levels corresponding to the conductive layers 13 and the sacrificial layers 11. The second protrusions 18_P may protrude between the insulating layers 12 and extend in the first direction I or the second direction II. The second protrusions 18_P may be coupled to the first protrusions 17_P located at the same levels.

The third slit structure 15 may pass through the stacked structure ST and extend in the first direction I. The third slit structure 15 may be adjacent to the first slit structure 17 in the second direction II. The slit structures SLS may be located between the third slit structures 15 neighboring each other in the second direction II. The third slit structure 15 may include an insulating material such as oxides or nitrides.

The first region R1 may be adjacent to the third slit structure 15, and the second region R2 may be spaced apart from the third slit structure 15.

Referring to FIGS. 2B, 2C, and 2D, the conductive layer 13 and the sacrificial layer 11 located at the same level may be separated from each other by the slit structure SLS. The conductive layers 13 in the first region R1 and the sacrificial layers 11 in the second region R2 may be separated from each other. Referring to FIGS. 2A, 2D, and 2E, the insulating layers 12 in the first region R1 and the insulating layers 12 in the second region R2 might not be separated from each other. Referring to FIG. 2E, the first protrusions 17_P and the second protrusions 18_P may be stacked alternately with the insulating layers 12. Therefore, the insulating layers 12 may pass through the slit structure SLS and extend from the first region R1 to the second region R2 in the second direction II. The insulating layer 12 in the first region R1 and the insulating layer 12 in the second region R2 which are located at the same level may be a single layer. Therefore, the slit structure SLS may be supported by the insulating layer 12.

Referring to FIGS. 2A and 2B, the contact plug 16 may pass through the stacked structure ST. The contact plug 16 may pass through the second region R2 of the stacked structure ST in the third direction III. The contact plug 16 may be adjacent to the slit structure SLS in the second direction II. The contact plug 16 may be located between adjacent slit structures SLS in the second direction II. The contact plug 16 and the conductive layers 13 may be insulated from each other by the sacrificial layers 11.

The contact plug 16 and the slit structure SLS may have substantially the same or different heights. According to an embodiment, an upper surface of the contact plug 16 and an upper surface of the slit structure SLS may be located at substantially the same level. The upper surface of the contact plug 16 and the upper surface of the slit structure SLS may be located in substantially the same plane as an upper surface of the stacked structure ST. According to an embodiment, a lower surface of the contact plug 16 and a lower surface of the slit structure SLS may be located at substantially the same level.

According to the above-described structure, by using the slit structure SLS, the first region R1 and the second region R2 may be separated from each other in the second level LV2. In addition, in the first level LV1, the slit structure SLS having a high aspect ratio may be supported by the insulating layers 12 passing through the slit structure SLS. Therefore, the slit structure SLS may have a stabilized structure with a high aspect ratio.

Figure 3A:
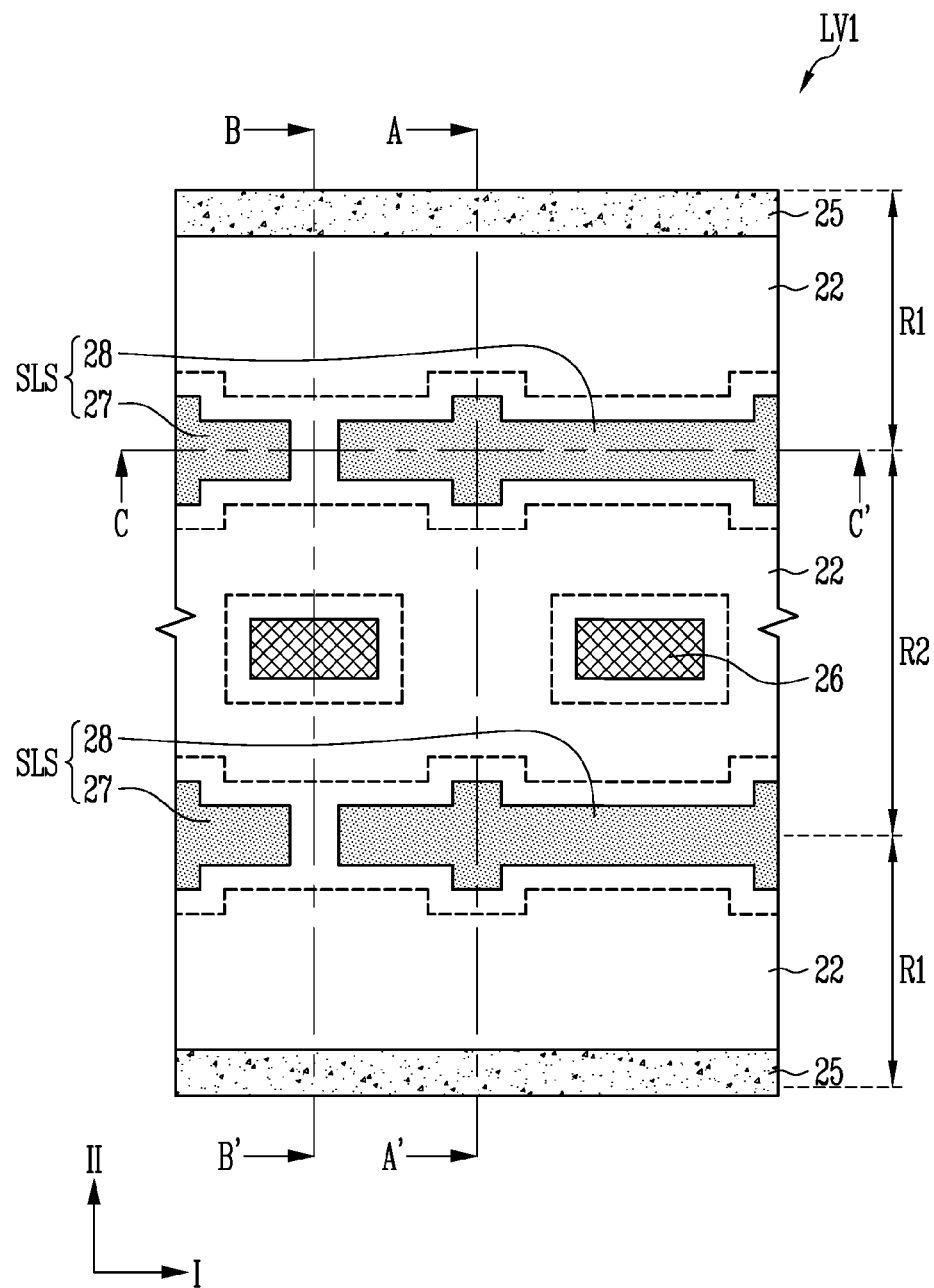
FIGS. 3A, 3B, 3C, 3D, and 3E are diagrams illustrating the structure of a semiconductor device according to an embodiment of the present disclosure.
Figure 3B:
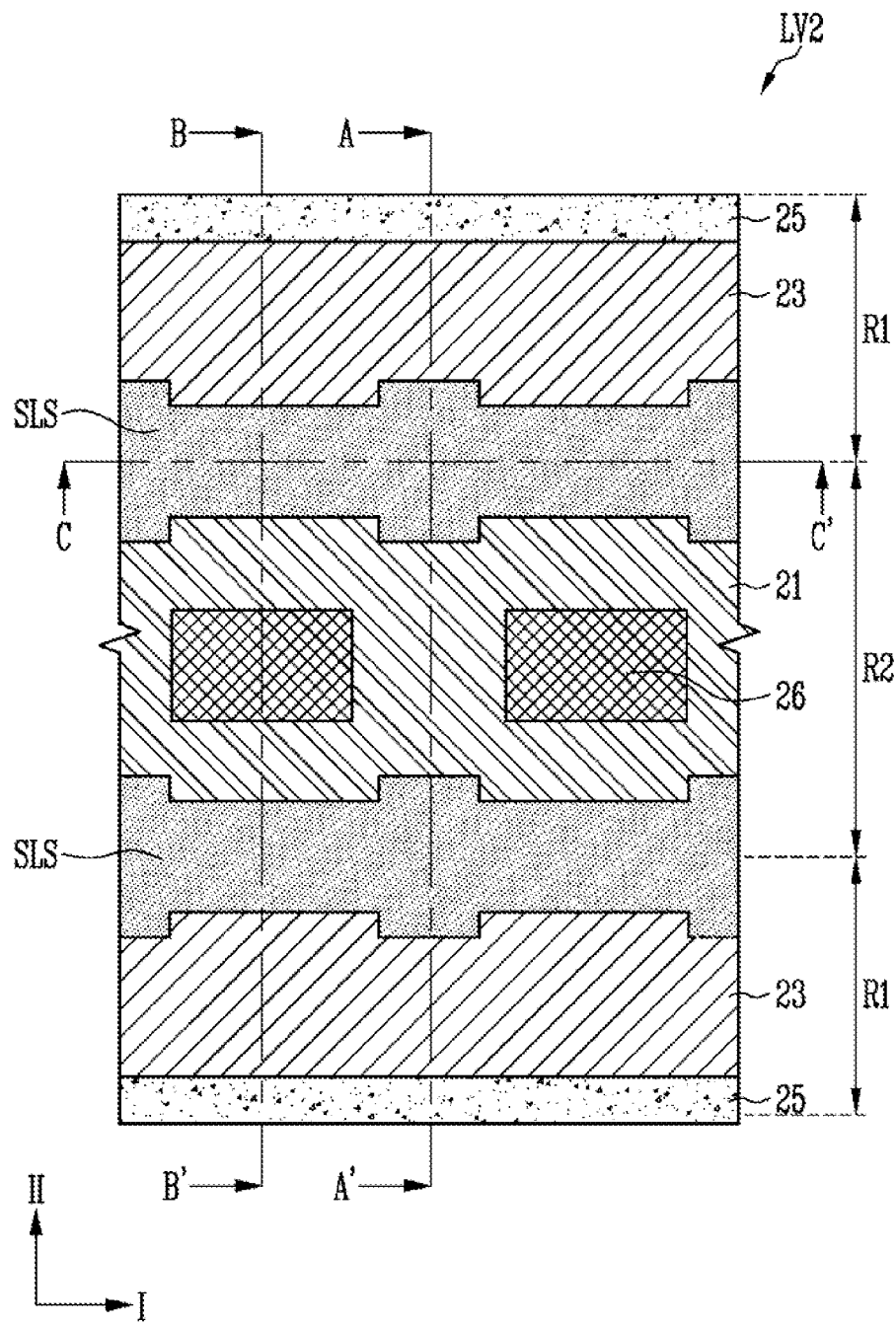
Figure 3C:
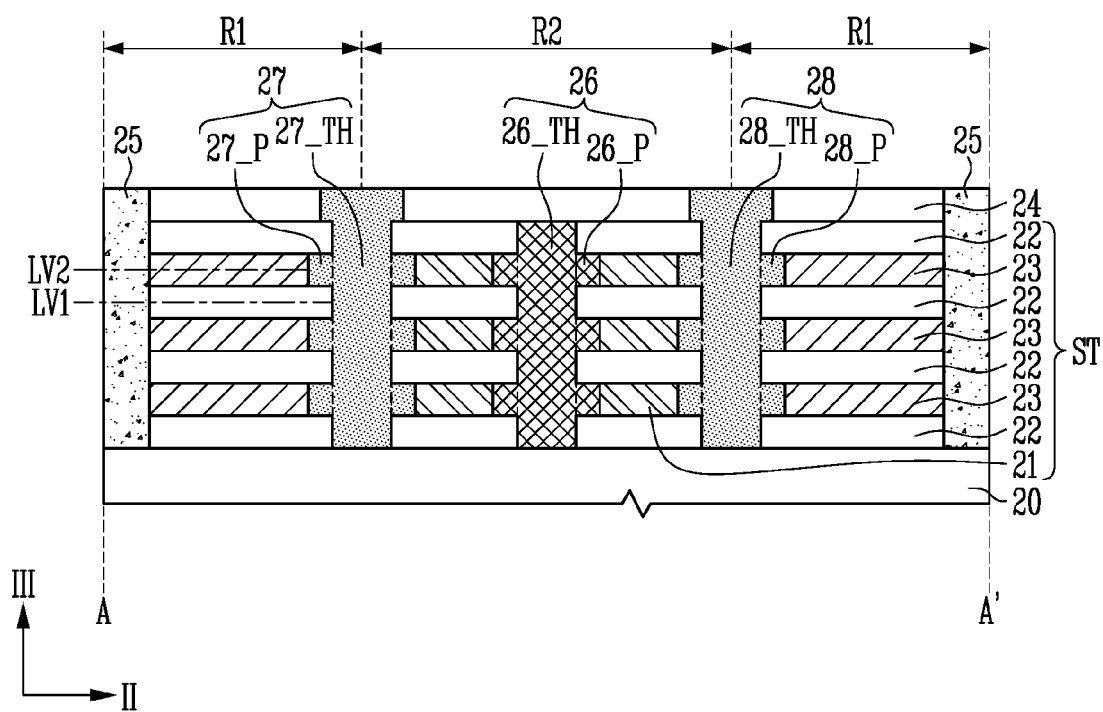
Figure 3D:
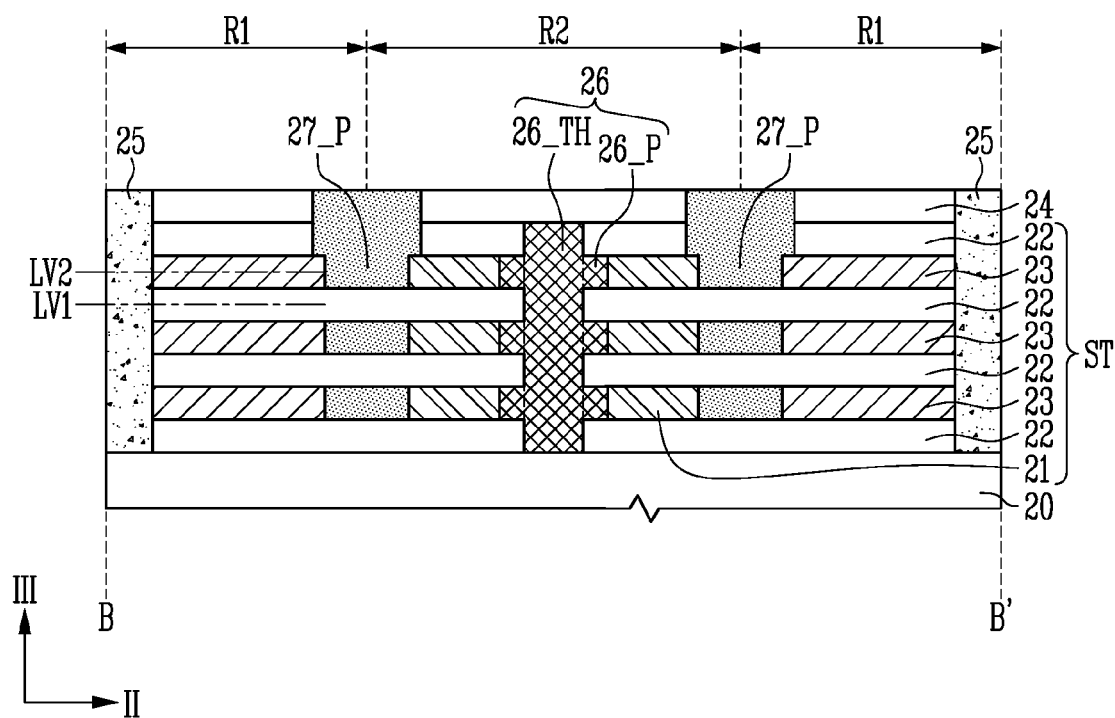
Figure 3E:
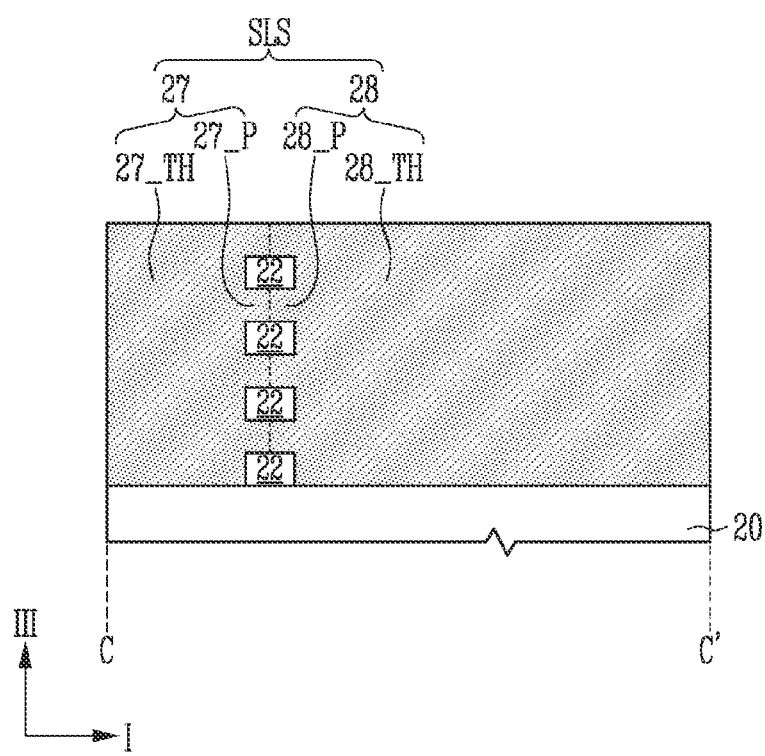

FIGS. 3A to 3E are diagrams illustrating the structure of a semiconductor device according to an embodiment of the present disclosure. FIG. 3A is a plan view of the first level LV1 and FIG. 3B is a plan view of the second level LV2. FIG. 3C is a cross-sectional view along A-A', FIG. 3D is a cross-sectional view along B-B', and FIG. 3E is a cross-sectional view along C-C'. In the following description, description of certain elements that are discussed above is omitted for the sake of brevity.

Referring to FIGS. 3A to 3E, the semiconductor device may include the stacked structure ST, the slit structure SLS and a contact plug 26. In addition, the semiconductor device may further include a source layer 20, an insulating layer 24, a third slit structure 25, and the like. The slit structure SLS may include a first slit structure 27 and a second slit structure 28.

The stacked structure ST may include insulating layers 22 stacked on each other, and sacrificial layers 21 and conductive layers 23 interposed between the insulating layers 22. The stacked structure ST may include the first region R1 and the second region R2. The source layer 20 may be located under the stacked structure ST. The insulating layer 24 may be located above the stacked structure ST.

The first slit structure 27 may include a first through portion 27_TH and first protrusions 27_P. The second slit structure 28 may include a second through portion 28_TH and second protrusions 28_P. The second protrusions 28_P may be coupled to the first protrusions 27_P located at the same level. The first protrusions 27_P and the second protrusions 28_P may be stacked alternately with the insulating layers 22. The third slit structure 25 may pass through the stacked structure ST and extend in the first direction I. The slit structures SLS may be located between adjacent third slit structures 25 in the second direction II.

The contact plug 26 may include a through portion 26_TH and protrusions 26_P. The through portion 26_TH may pass through the second region R2 of the stacked structure ST in the third direction III. The protrusions 26_P may extend from sidewalls of the through portion 26_TH. The protrusions 26_P of the contact plug 26 may be located at levels corresponding to the conductive layers 23 and the sacrificial layers 21. The protrusions 26_P of the contact plug 26 may be located at levels corresponding to the protrusions 27_P and 28_P of the slit structure SLS. The protrusions 26_P of the contact plug 26 may be spaced apart from the protrusions 27_P and 28_P of the slit structure SLS.

The contact plug 26 and the slit structure SLS may have substantially different heights. According to an embodiment, an upper surface of the contact plug 26 and an upper surface of the slit structure SLS may be located at substantially different levels from each other. The upper surface of the slit structure SLS may be higher than the upper surface of the contact plug 26. The upper surface of the contact plug 26 may be located at substantially the same plane as the upper surface of the stacked structure ST. The slit structure SLS may pass through the insulating layer 24 and the stacked structure ST. The upper surface of the slit structure SLS may be located at substantially the same plane as an upper surface of the insulating layer 24. A lower surface of the slit structure SLS may be located at substantially the same plane as an upper surface of the source layer 20, or inside the source layer 20.

According to the above-described structure, by using the slit structure SLS, the first region R1 and the second region R2 may be separated from each other in the second level LV2. In addition, in the first level LV1, the slit structure SLS having a high aspect ratio may be supported by the insulating layers 22 passing through the slit structure SLS. Therefore, the slit structure SLS may have a stabilized structure with a high aspect ratio.

Figure 4A:
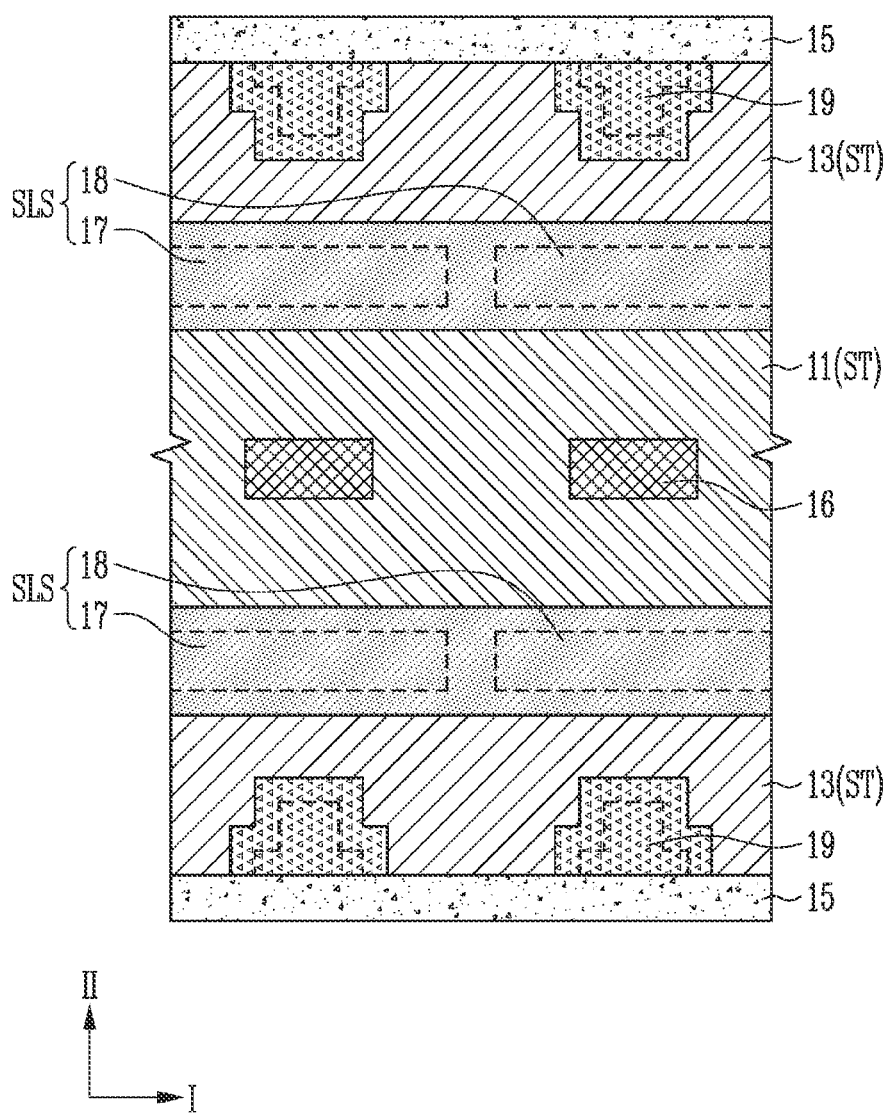
FIGS. 4A and 4B are layout views illustrating the structure of a semiconductor device according to an embodiment of the present disclosure.
Figure 4B:
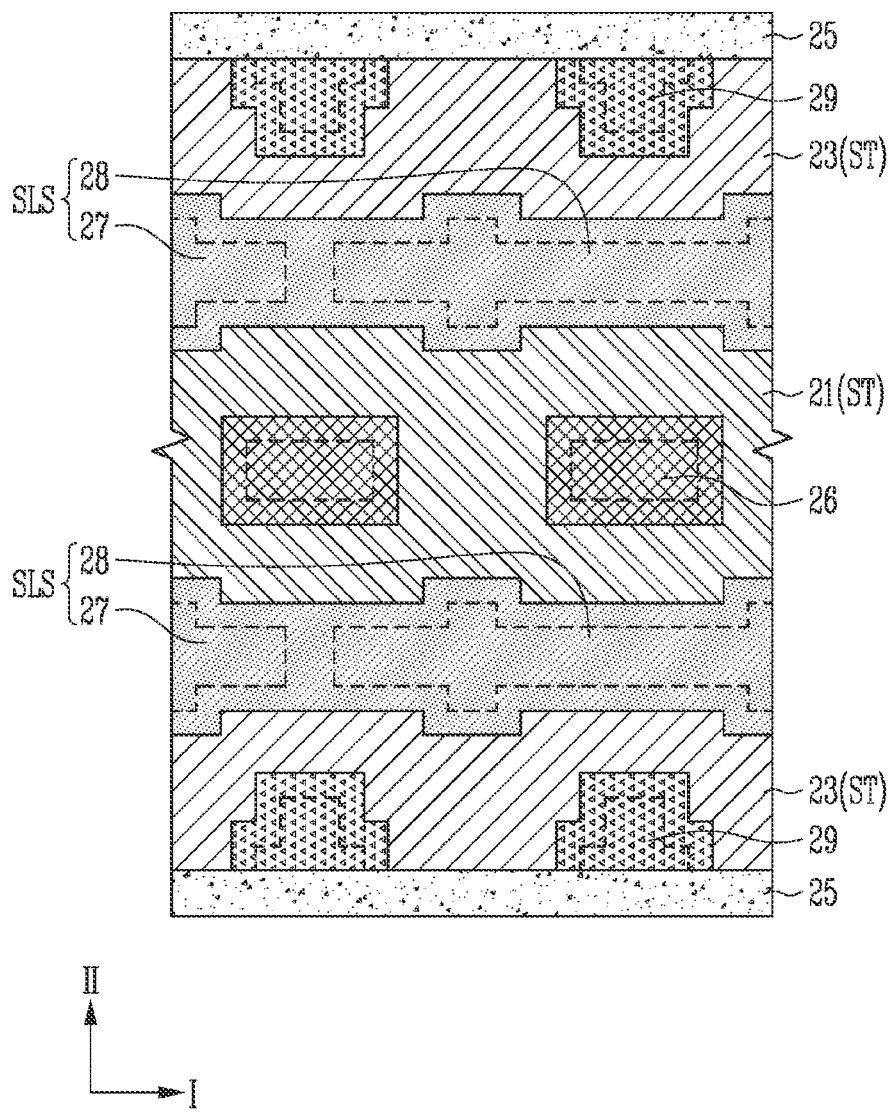

FIGS. 4A and 4B are layout views illustrating the structure of a semiconductor device according to an embodiment of the present disclosure. In the following description, description of certain elements that are discussed above is omitted for the sake of brevity.

Referring to FIG. 4A, the semiconductor device may include the slit structure SLS, the third slit structure 15, a fourth slit structure 19, the contact plug 16, and the stacked structure ST. The slit structure SLS may include the first slit structure 17 and the second slit structure 18. The stacked structure ST may include the conductive layers 13 stacked on top of one another and insulating layers (such as the insulating layers 12 shown in FIGS. 2A to 2E) interposed between the conductive layers 13. The conductive layers 13 and the insulating layers 12 may be alternately stacked between the slit structure SLS and the third slit structure 15 neighboring each other in the second direction II. The sacrificial layers 11 and the insulating layers 12 may be alternately stacked between adjacent slit structures SLS in the second direction II.

The fourth slit structure 19 may pass through the stacked structure ST. The conductive layers 13 may surround sidewalls of the fourth slit structure 19. The insulating layers 12 may surround the sidewalls of the fourth slit structure 19. The fourth slit structure 19 may be located between the slit structure SLS and the third slit structure 15. The fourth slit structure 19 may contact the third slit structure 15.

The fourth slit structure 19 may have a similar cross-sectional shape to the slit structure SLS. The fourth slit structure 19 may include a through portion passing through the stacked structure ST and protrusions extending from a side wall of the through portion. When the fourth slit structure 19 contacts the third slit structure 15, a protrusion might not be formed on a sidewall of the fourth slit structure 19 which contacts the third slit structure 15, whereas protrusions may be formed on the remaining sidewall thereof.

Referring to FIG. 4B, the semiconductor device may include the slit structure SLS, the third slit structure 25, a fourth slit structure 29, the contact plug 26, and the stacked structure ST. The slit structure SLS may include the first slit structure 27 and the second slit structure 28. The stacked structure ST may include the conductive layers 23 stacked on top of one another and insulating layers (such as the insulating layers 22 shown in FIGS. 3A to 3E) interposed between the conductive layers 23. The conductive layers 23 and the insulating layers 22 may be alternately stacked between the slit structure SLS and the third slit structure 25 neighboring each other in the second direction II. The sacrificial layers 21 and the insulating layers 22 may be alternately stacked between adjacent slit structures SLS in the second direction II.

The fourth slit structure 29 may pass through the stacked structure ST. The conductive layers 23 may surround sidewalls of the fourth slit structure 29. The insulating layers 22 may surround the sidewalls of the fourth slit structure 29. The fourth slit structure 29 may be located between the slit structure SLS and the third slit structure 25. The fourth slit structure 29 may contact the third slit structure 25.

The fourth slit structure 29 may have a cross-sectional shape similar to the slit structure SLS or the contact plug 26. The fourth slit structure 29 may include a through portion passing through the stacked structure ST and protrusions extending from a side wall of the through portion. When the fourth slit structure 29 contacts the third slit structure 25, the protrusion might not be formed on the sidewall of the fourth slit structure 29 which contacts the third slit structure 25, whereas protrusions may be formed on the remaining sidewall thereof.

However, in the present disclosure, the shape, number and arrangement of the slit structure (SLS, 15, 19, 25, or 29) may vary within the spirit of the disclosure.

Figure 5A:
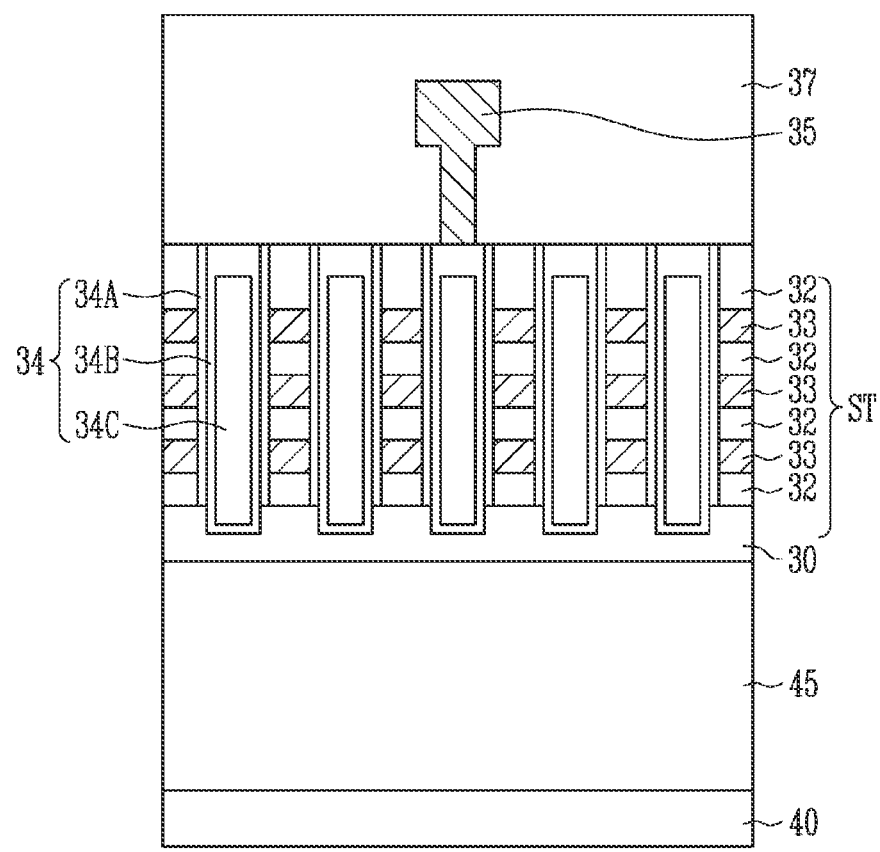
FIGS. 5A and 5B are layout views illustrating the structure of a semiconductor device according to an embodiment of the present disclosure.
Figure 5B:
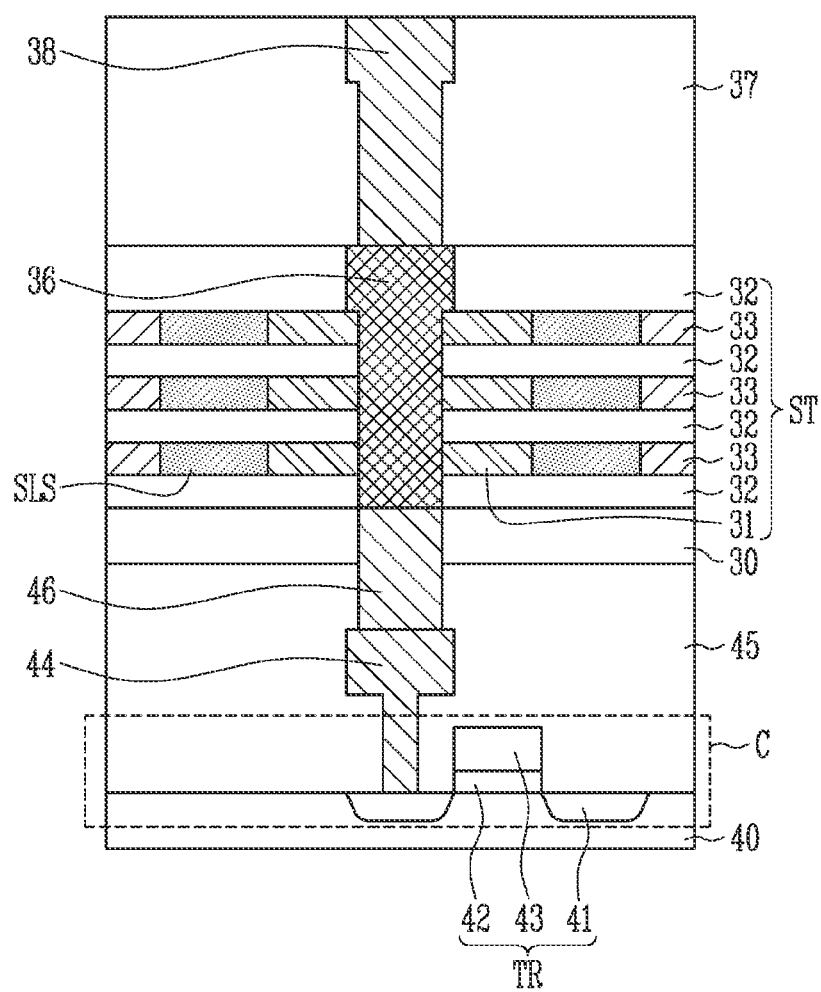
Figure 6A:
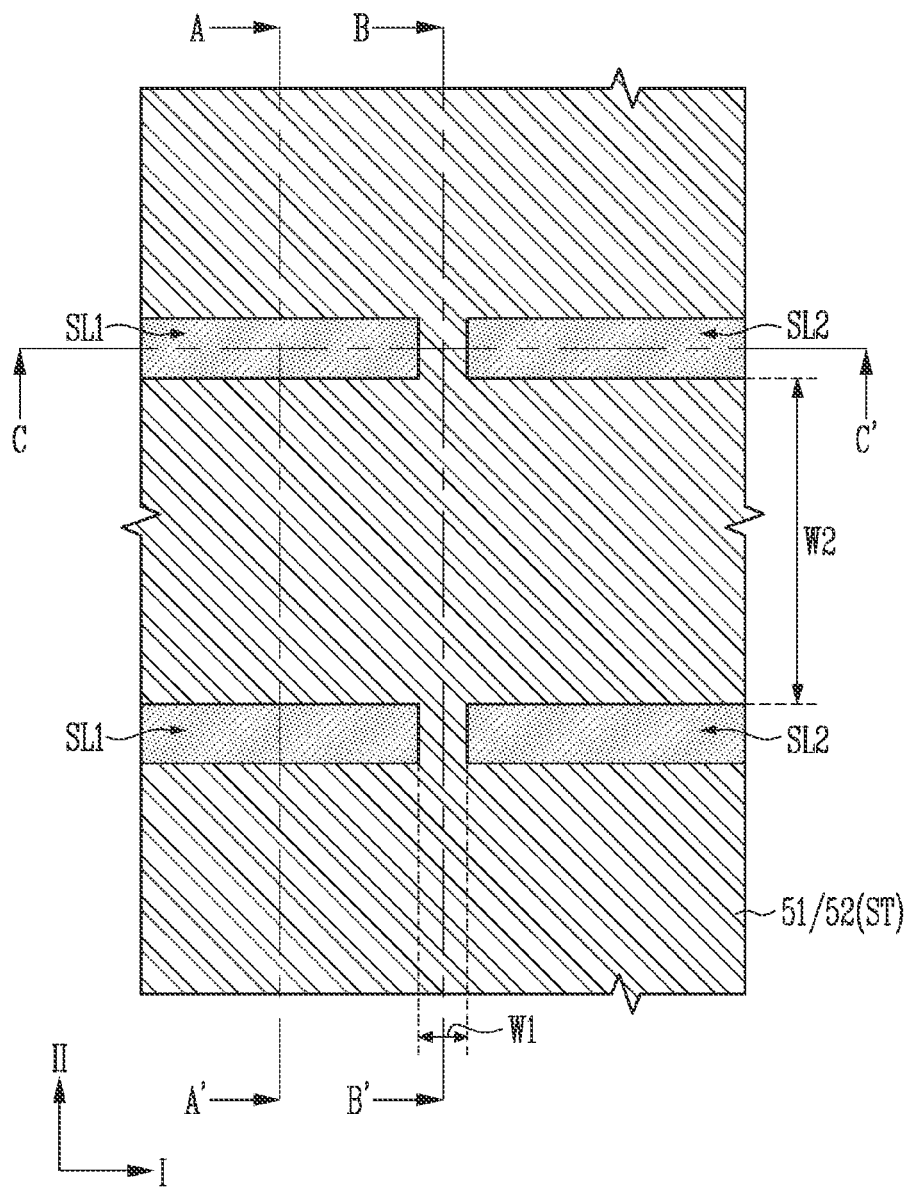
Figure 6B:
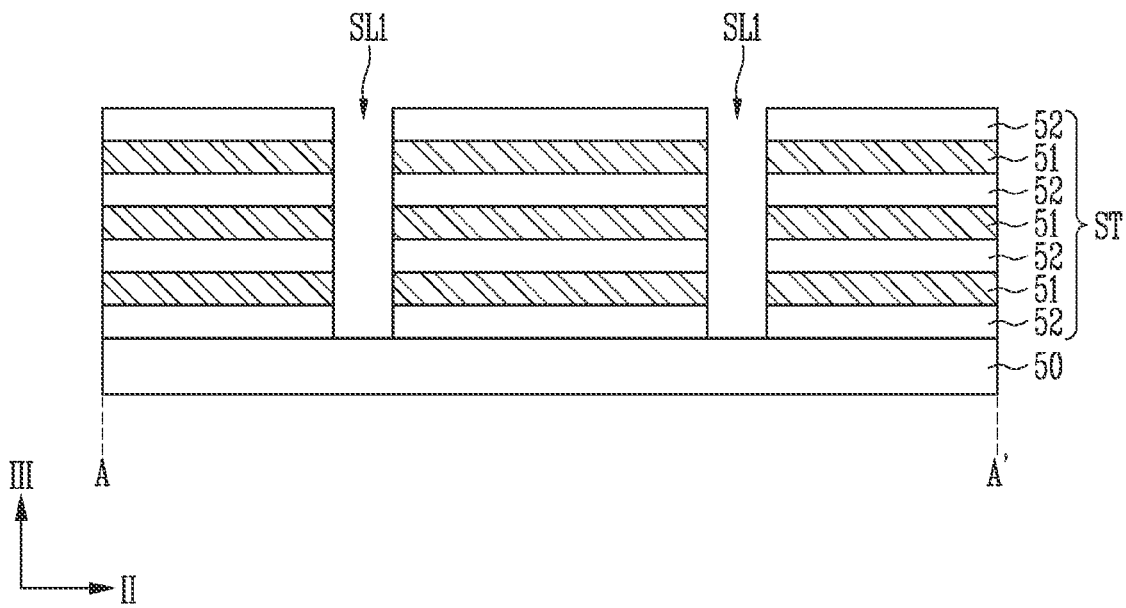
Figure 6C:
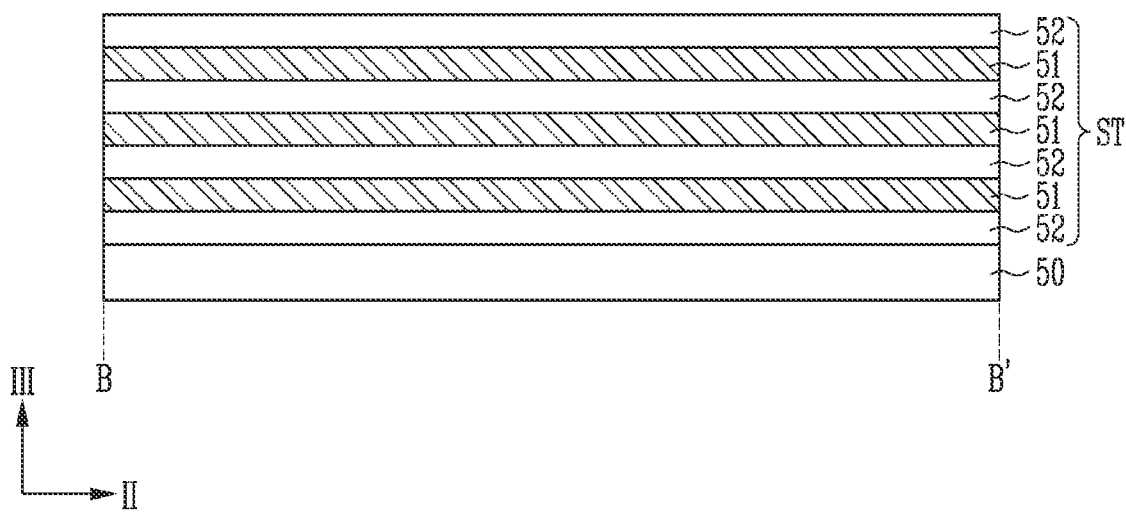
Figure 6D:
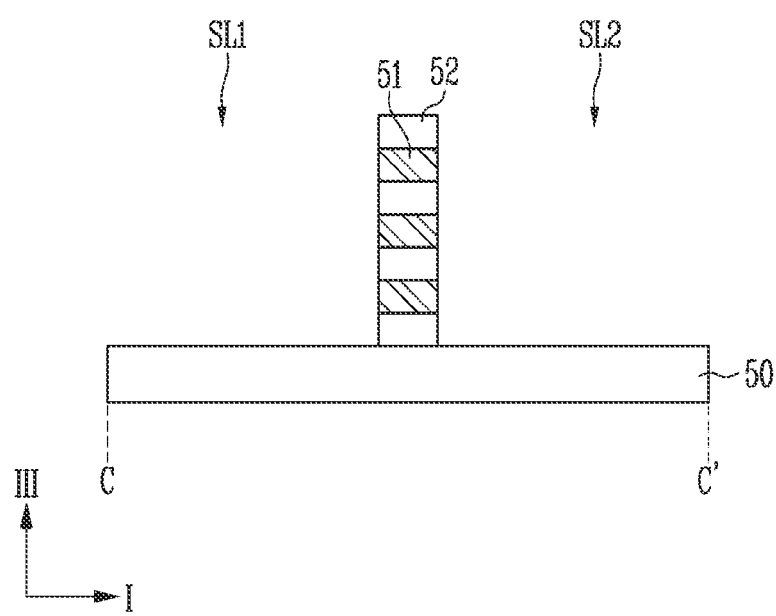
Figure 7B:
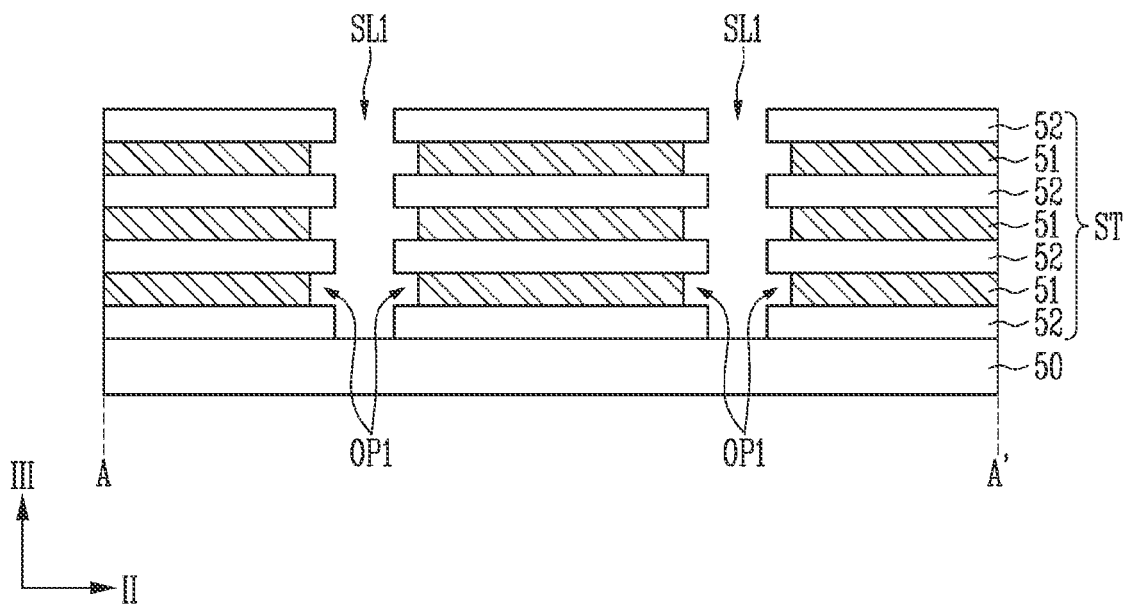
Figure 7C:
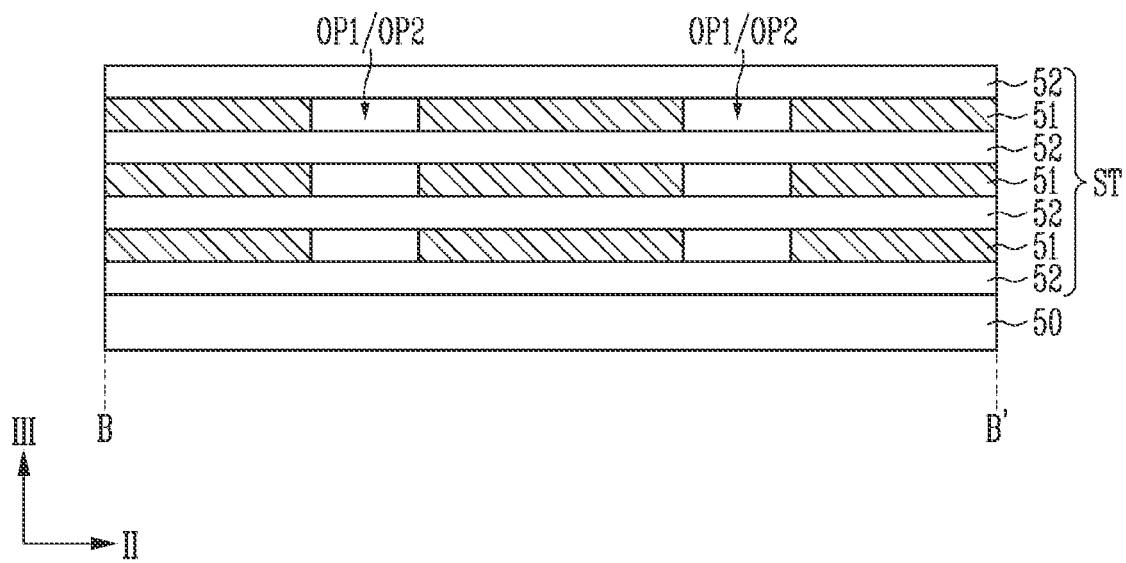
Figure 7D:
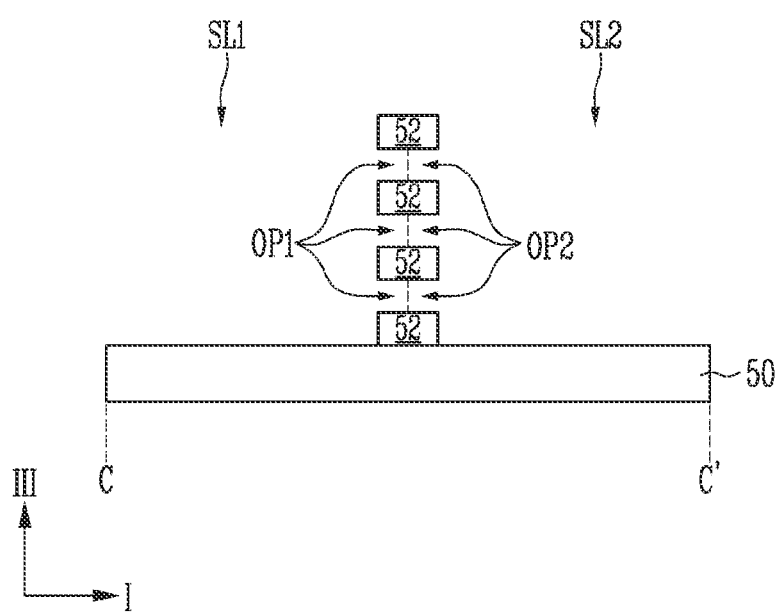
Figure 8B:
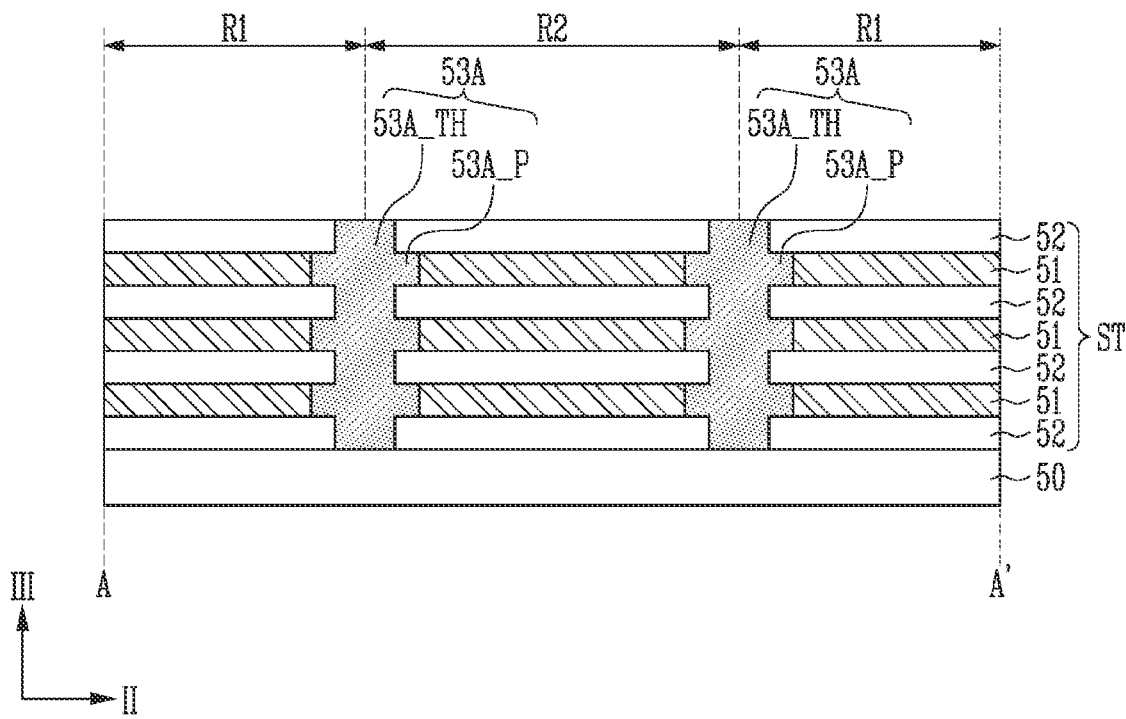
Figure 8C:
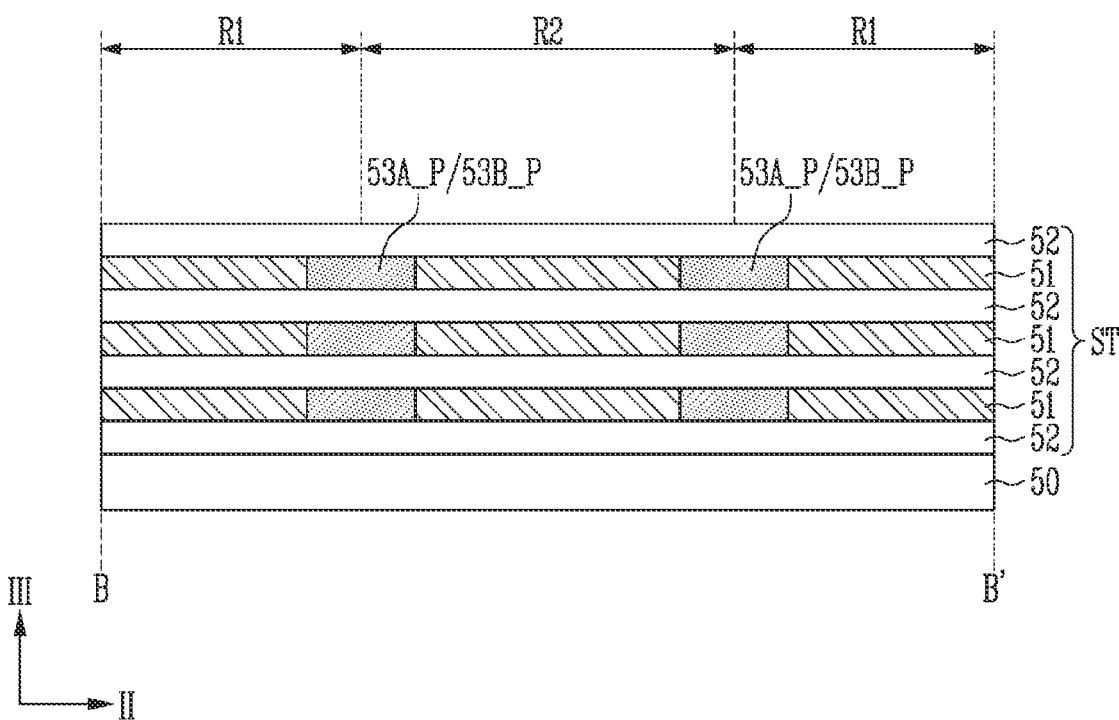
Figure 9A:
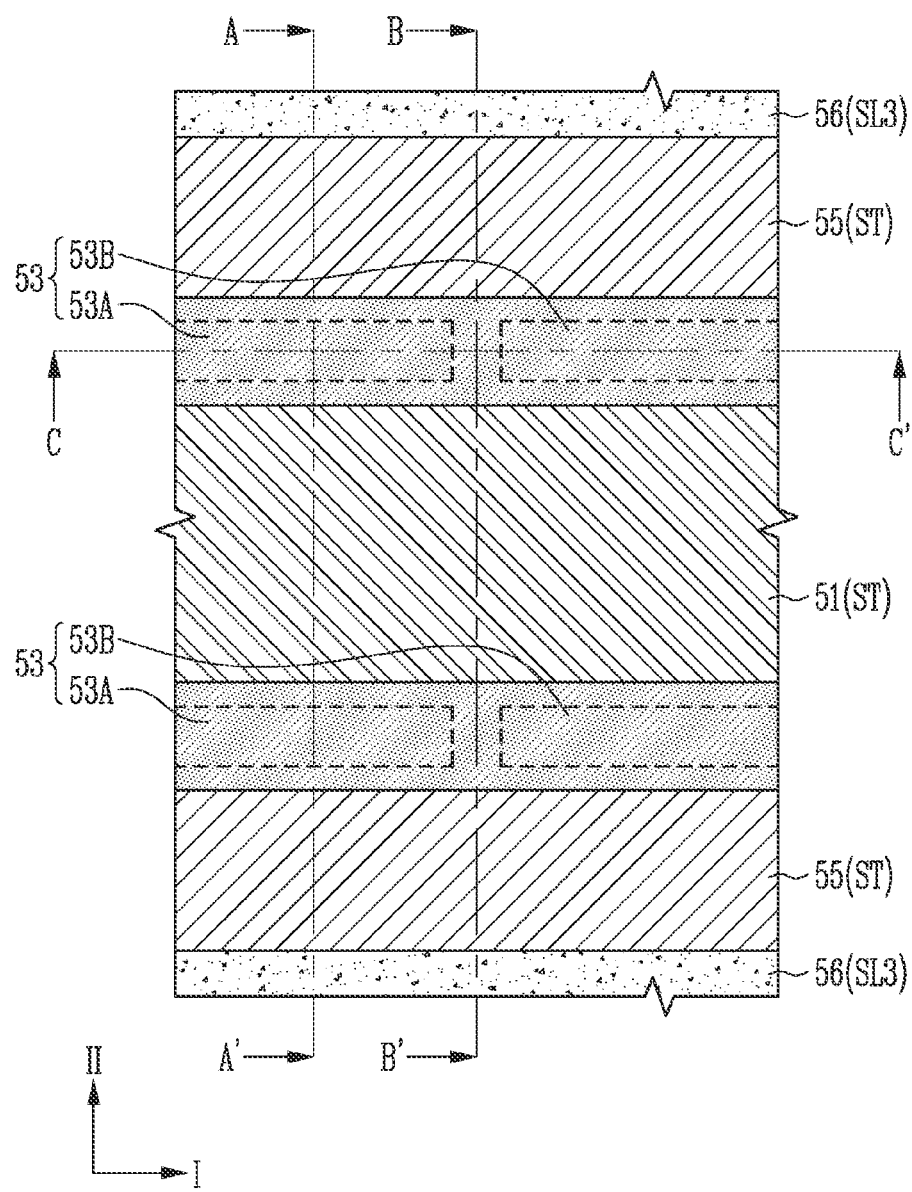
Figure 9B:
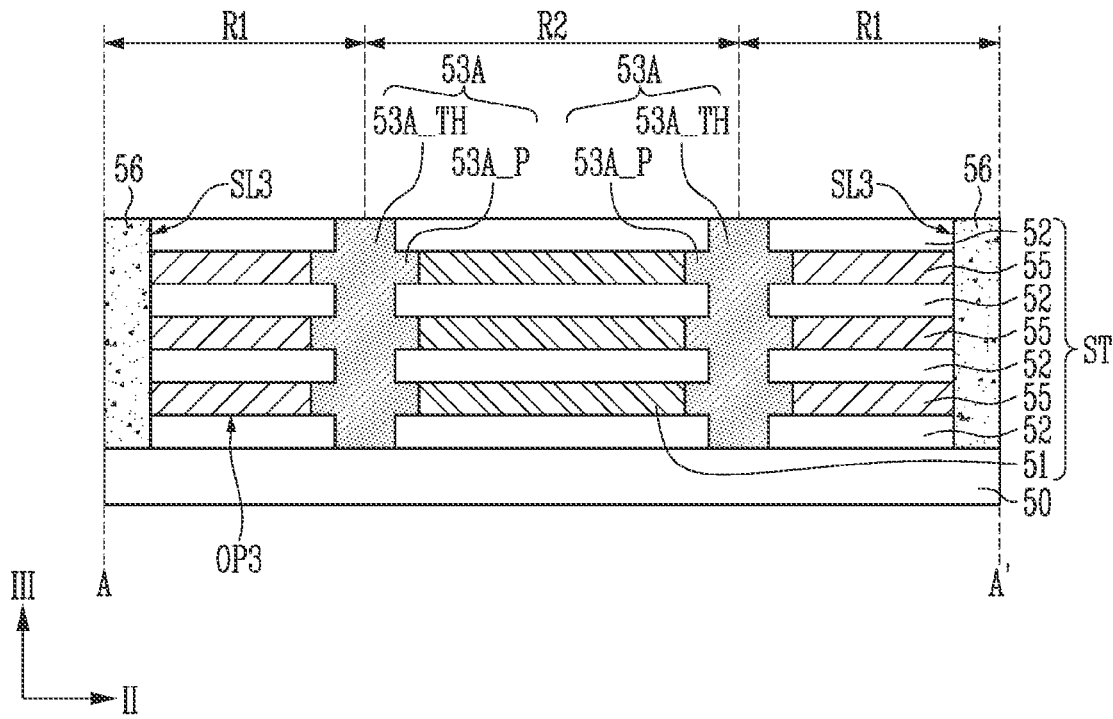
Figure 9C:
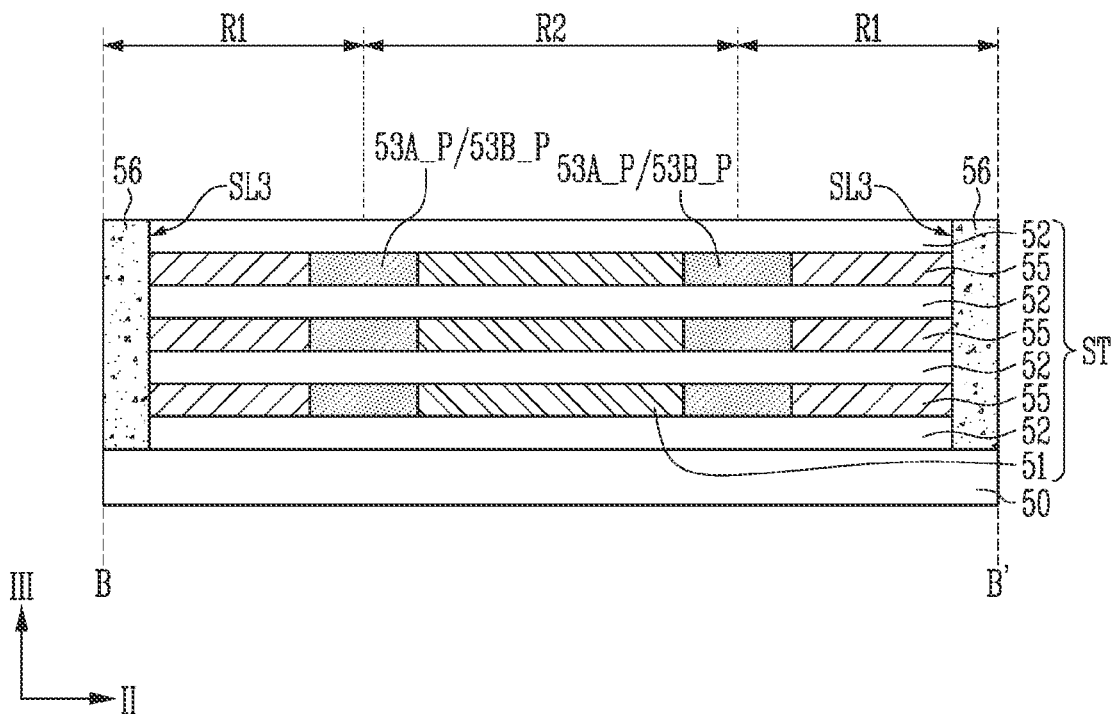
Figure 9D:
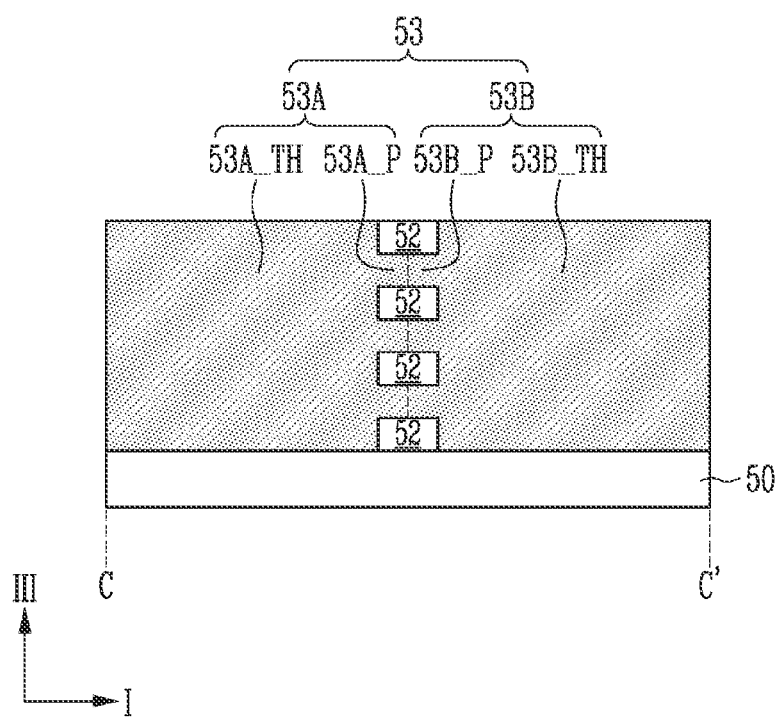
Figure 10A:
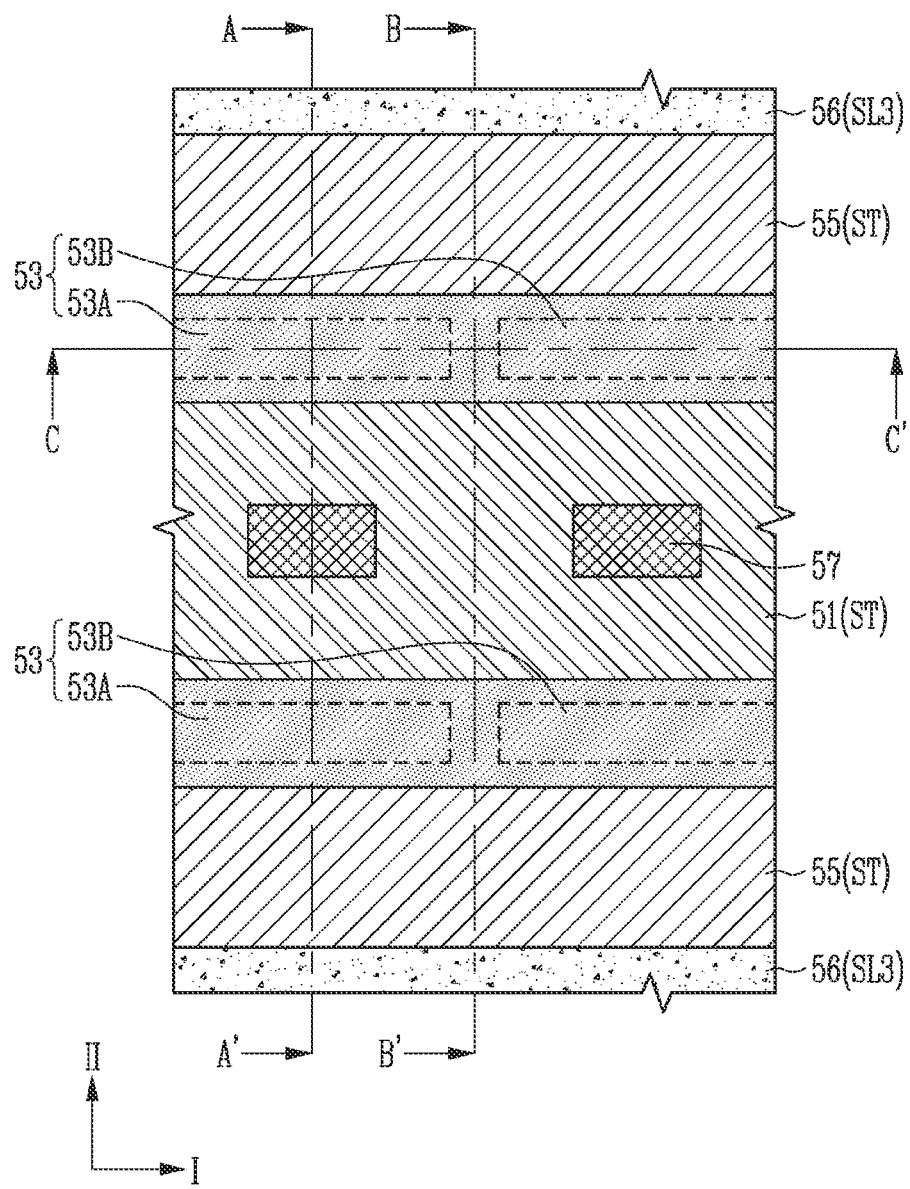
Figure 10B:
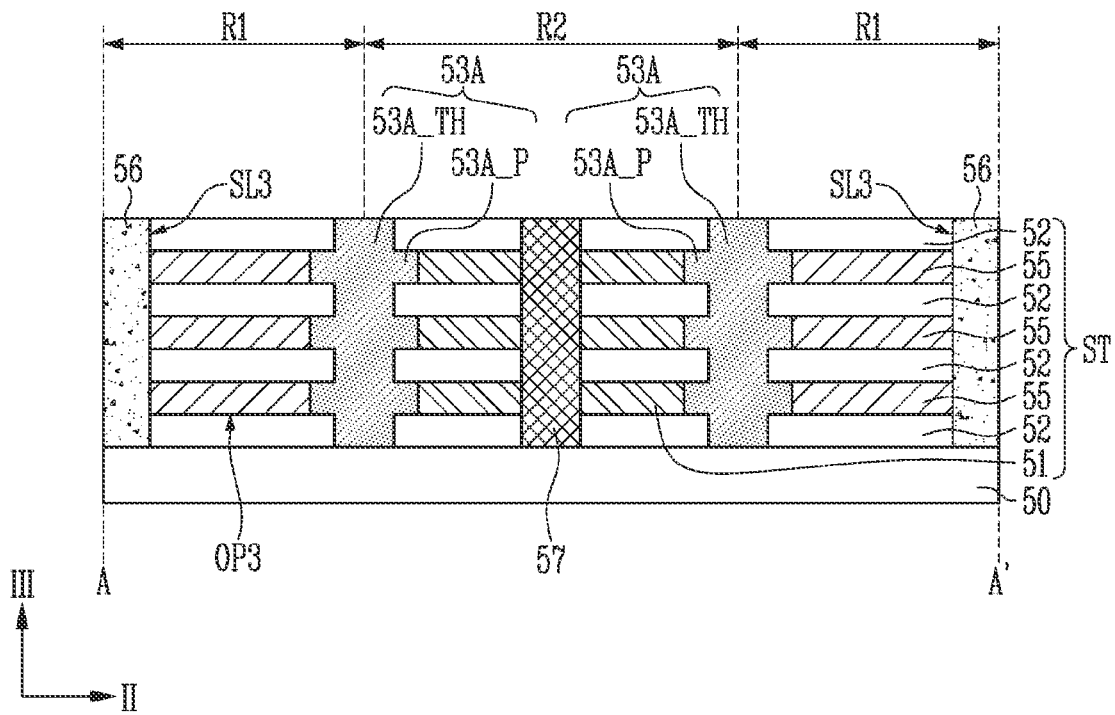
Figure 10C:
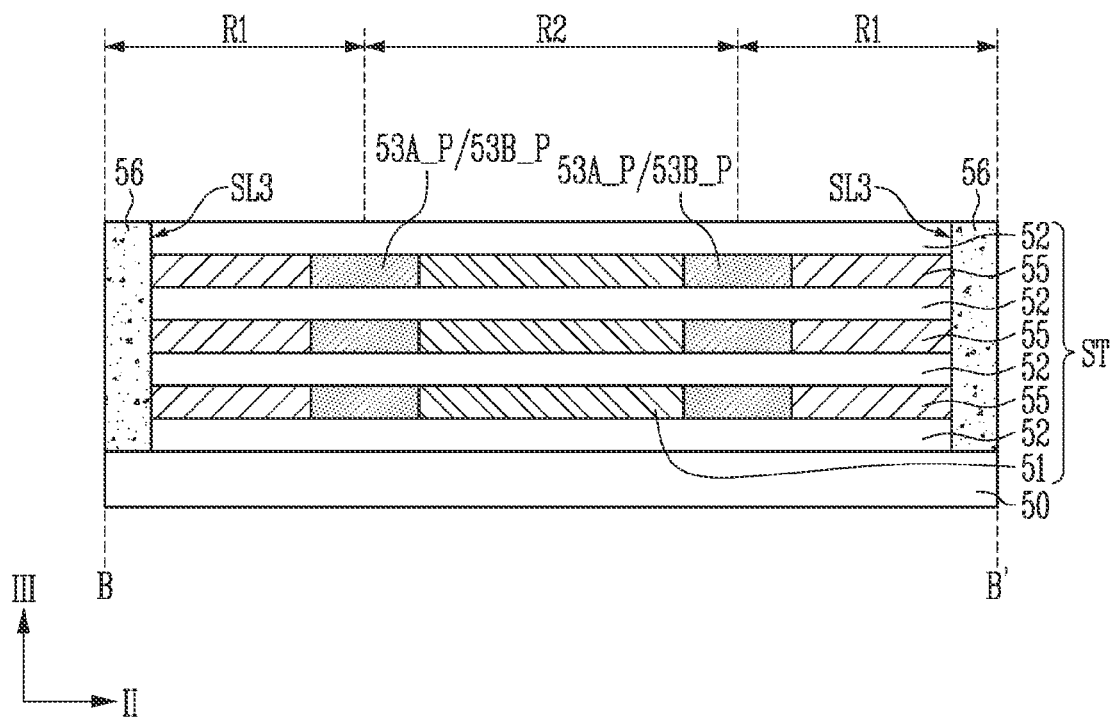
Figure 10D:
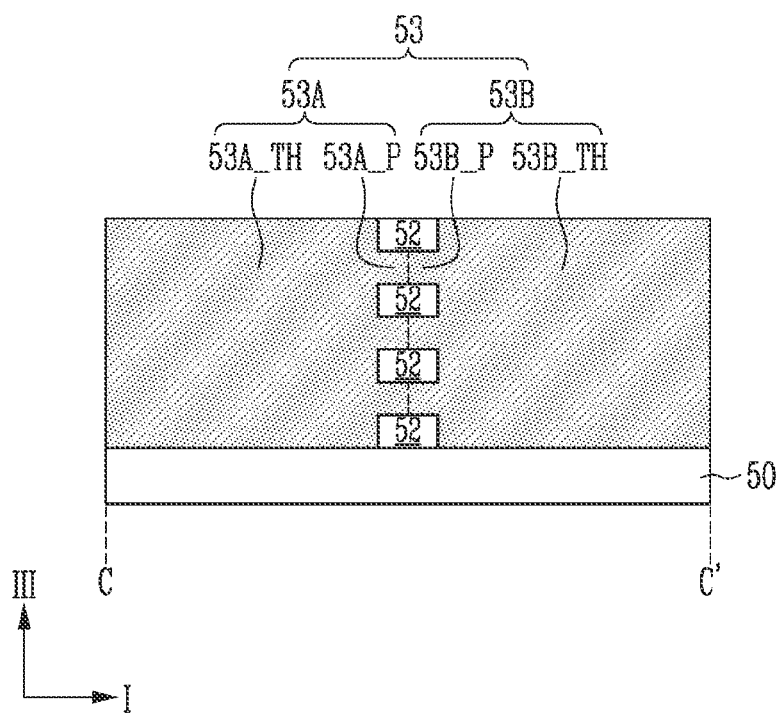
Figure 11A:
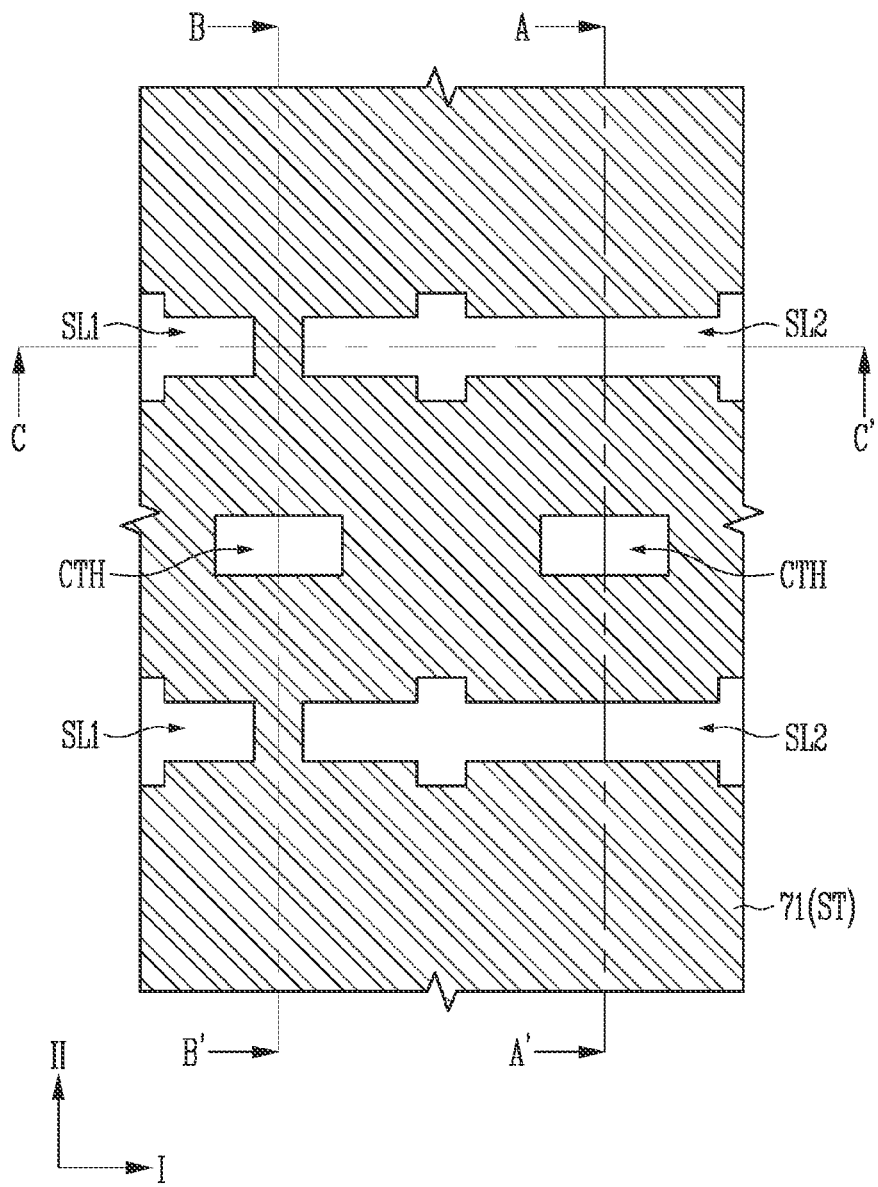
Figure 11B:
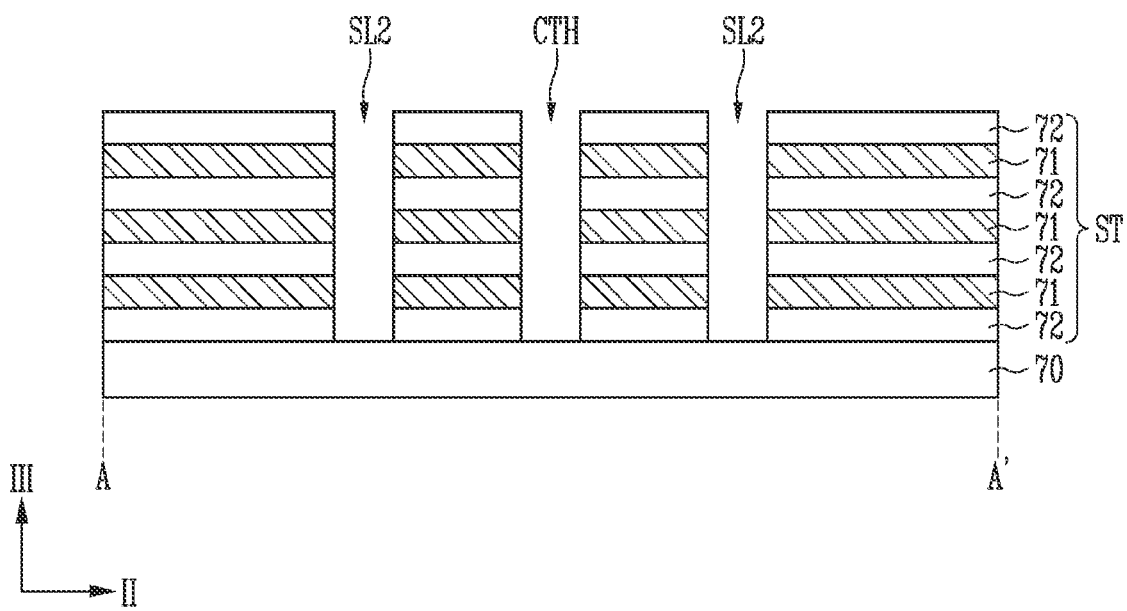
Figure 11C:
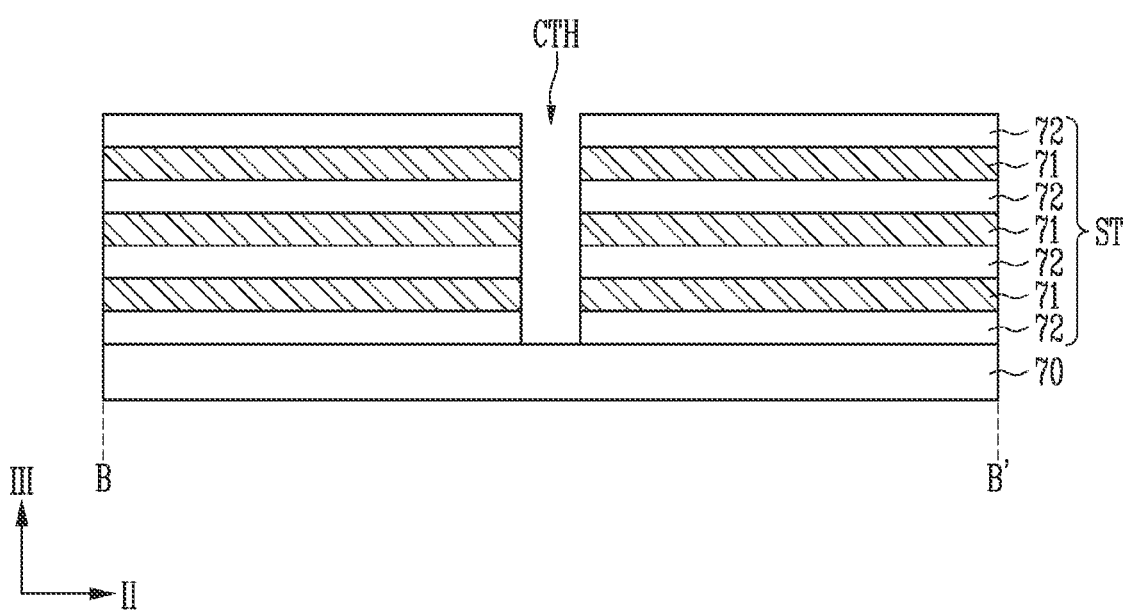
Figure 11D:
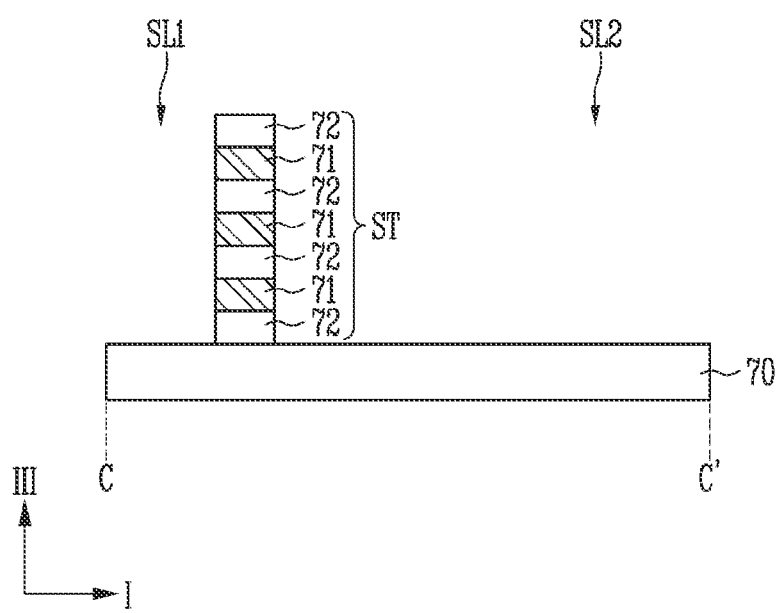
Figure 12B:
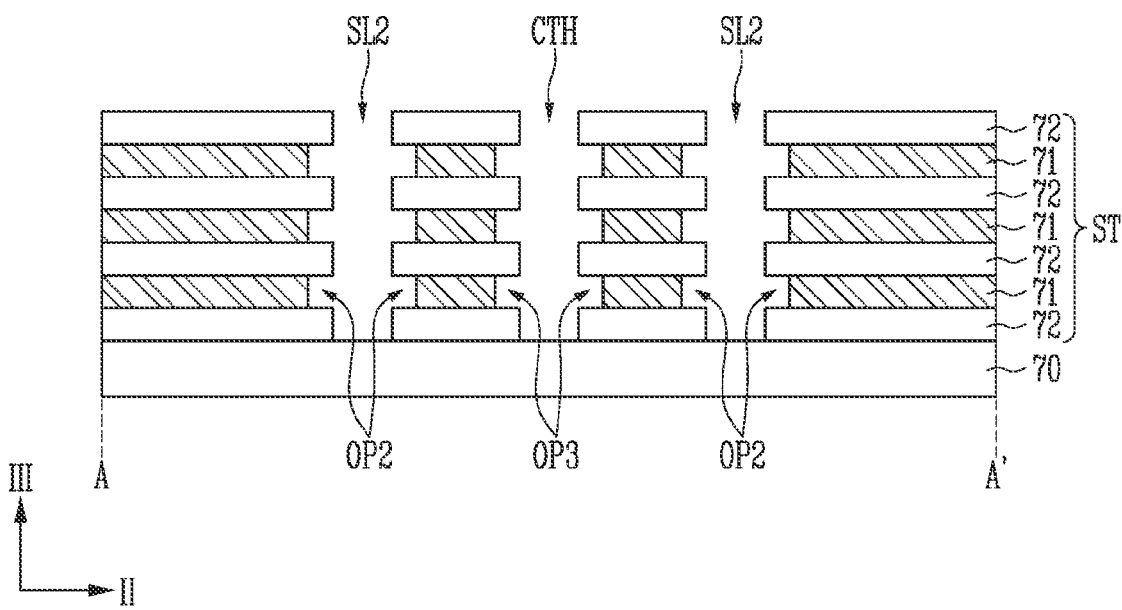
Figure 12C:
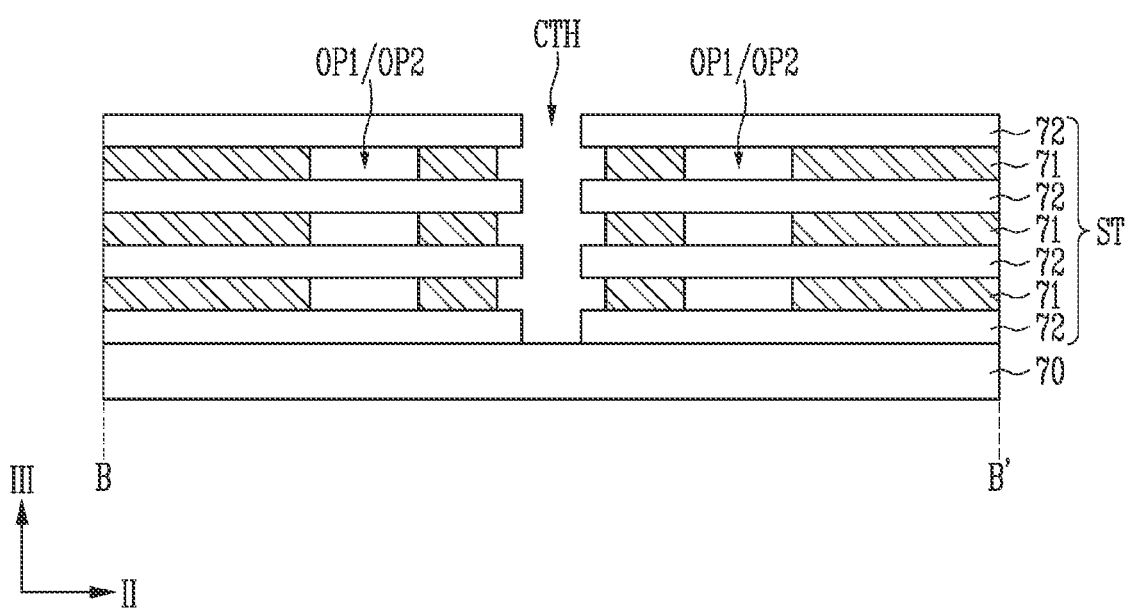
Figure 12D:
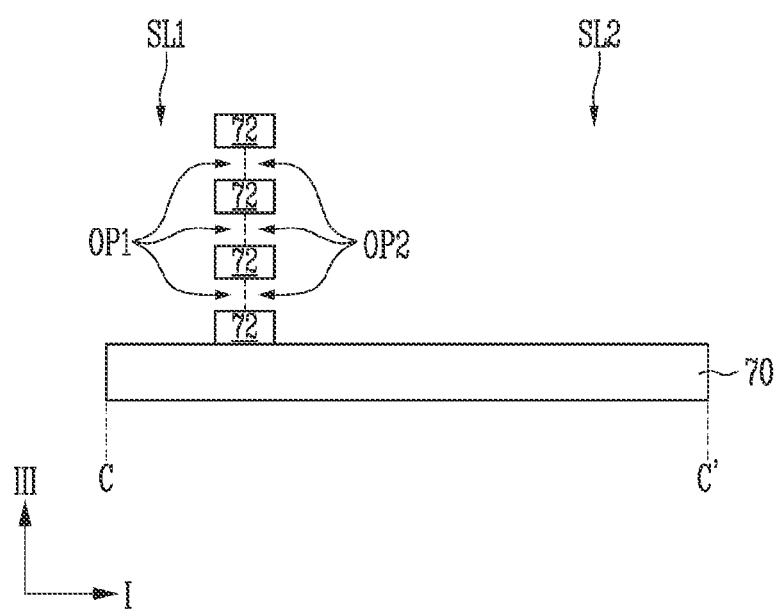
Figure 13A:
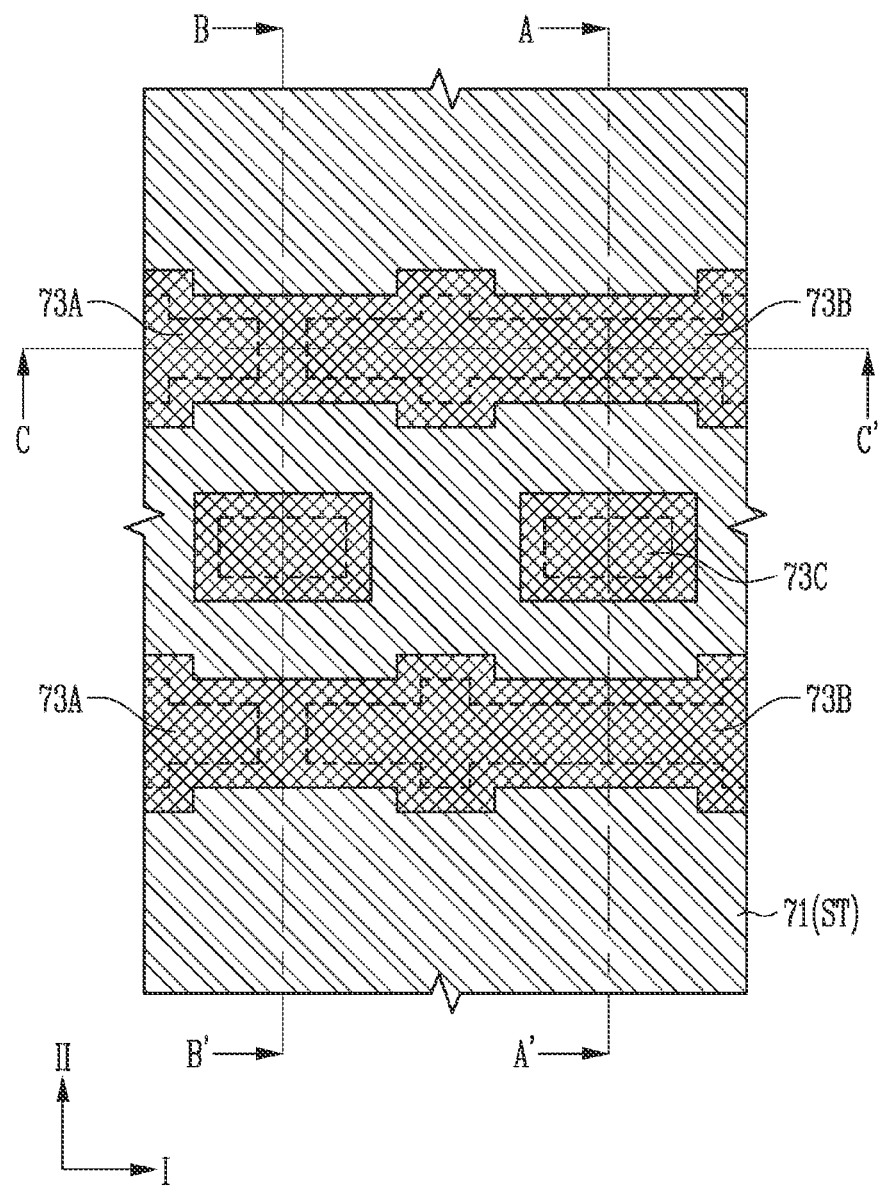
Figure 13B:
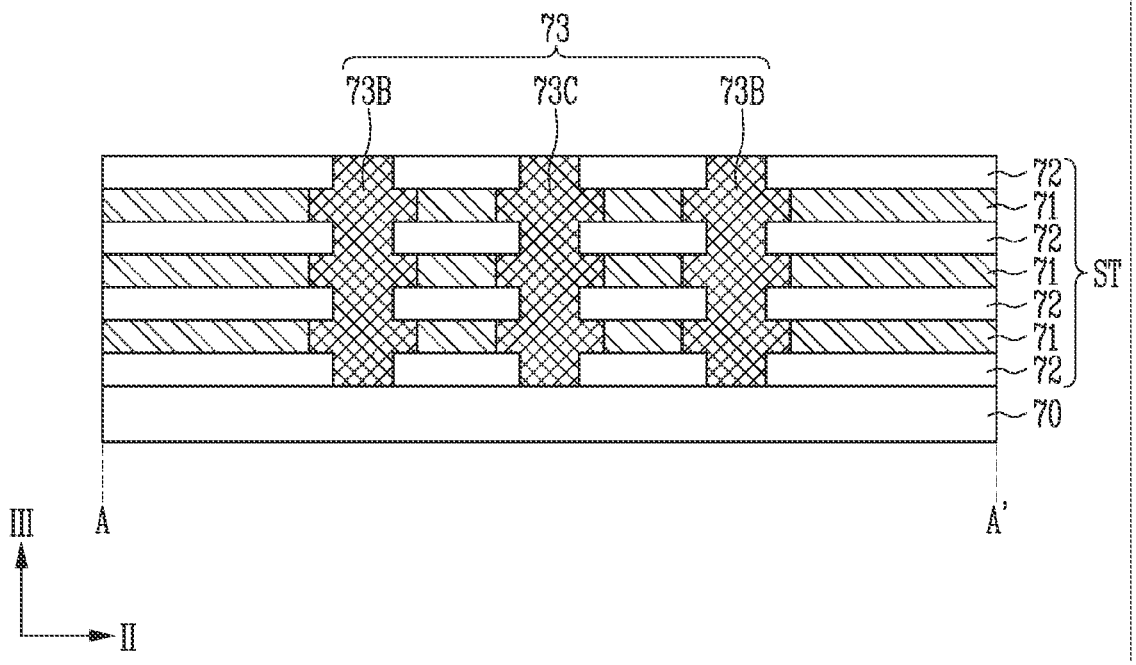
Figure 13C:
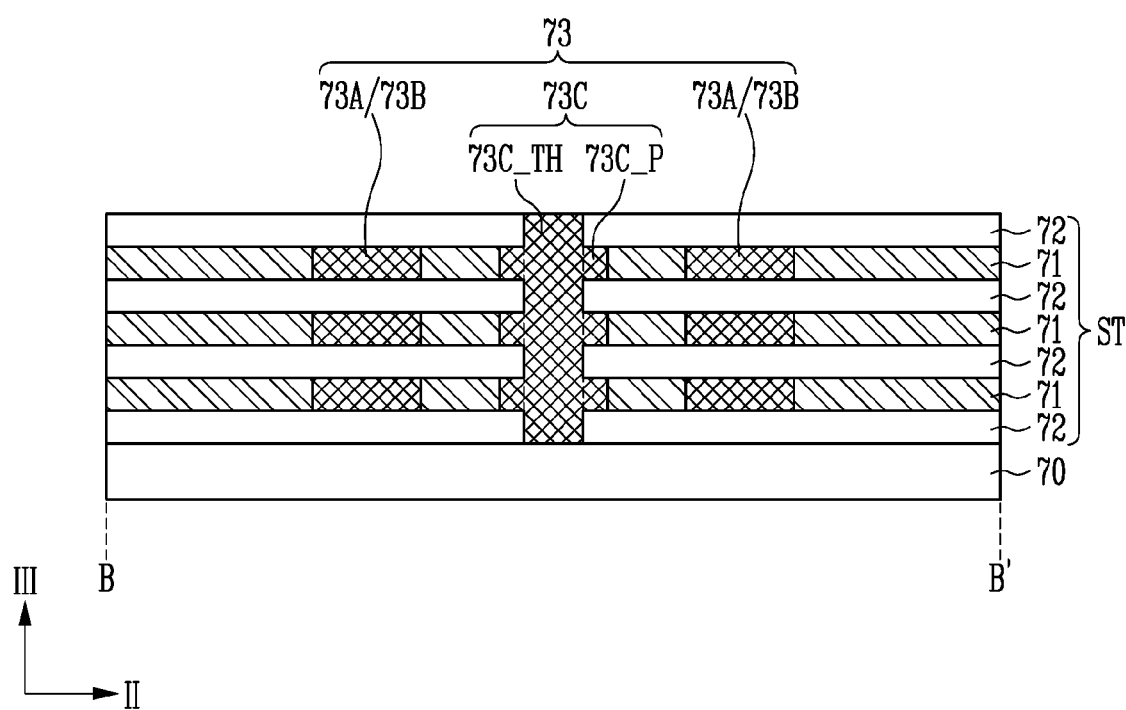
Figure 13D:
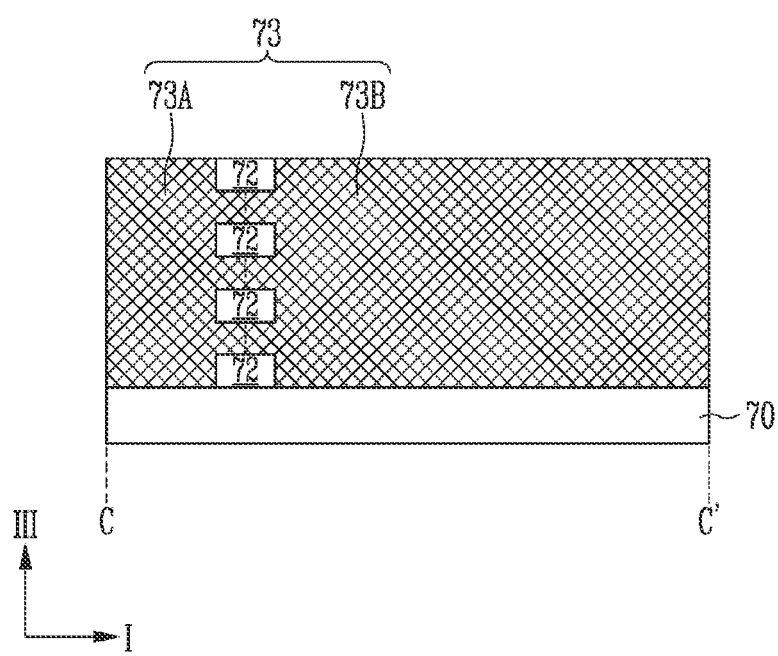
Figure 14A:
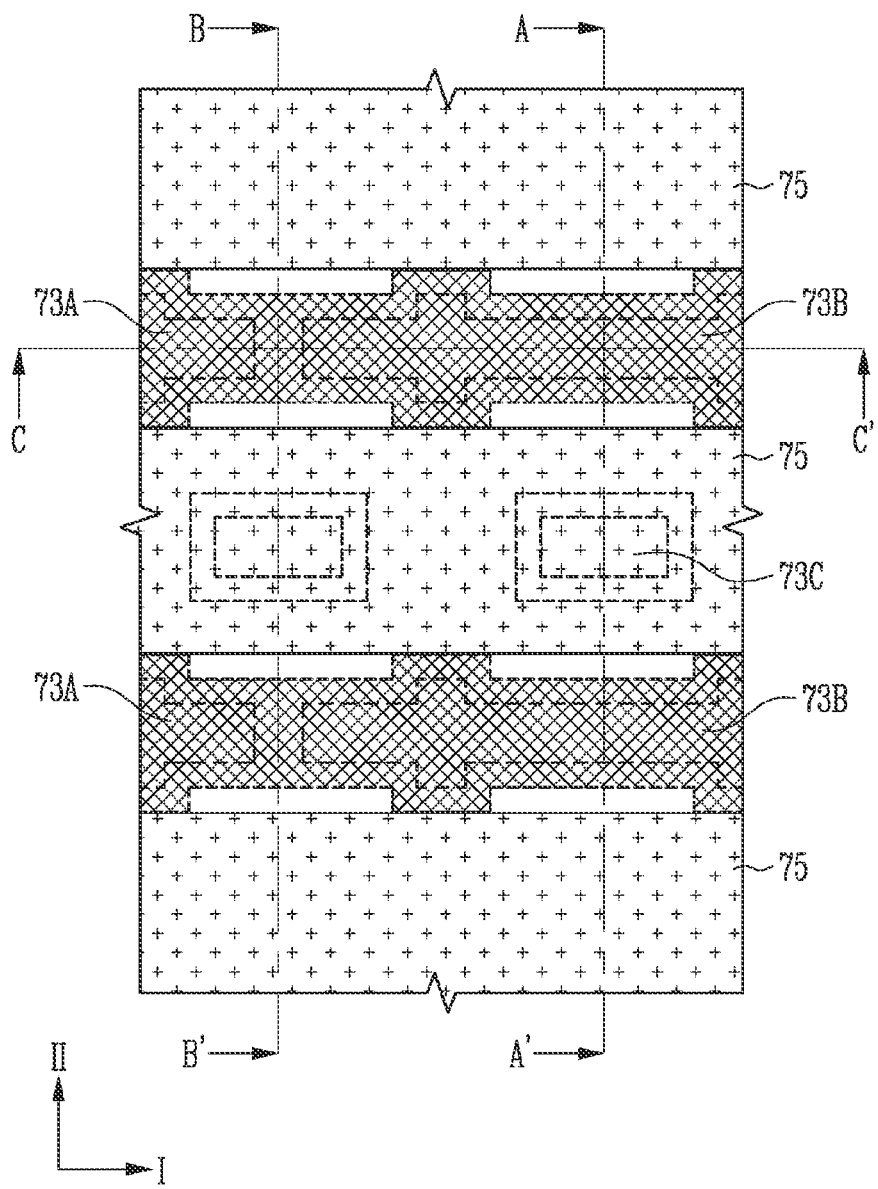
Figure 14B:
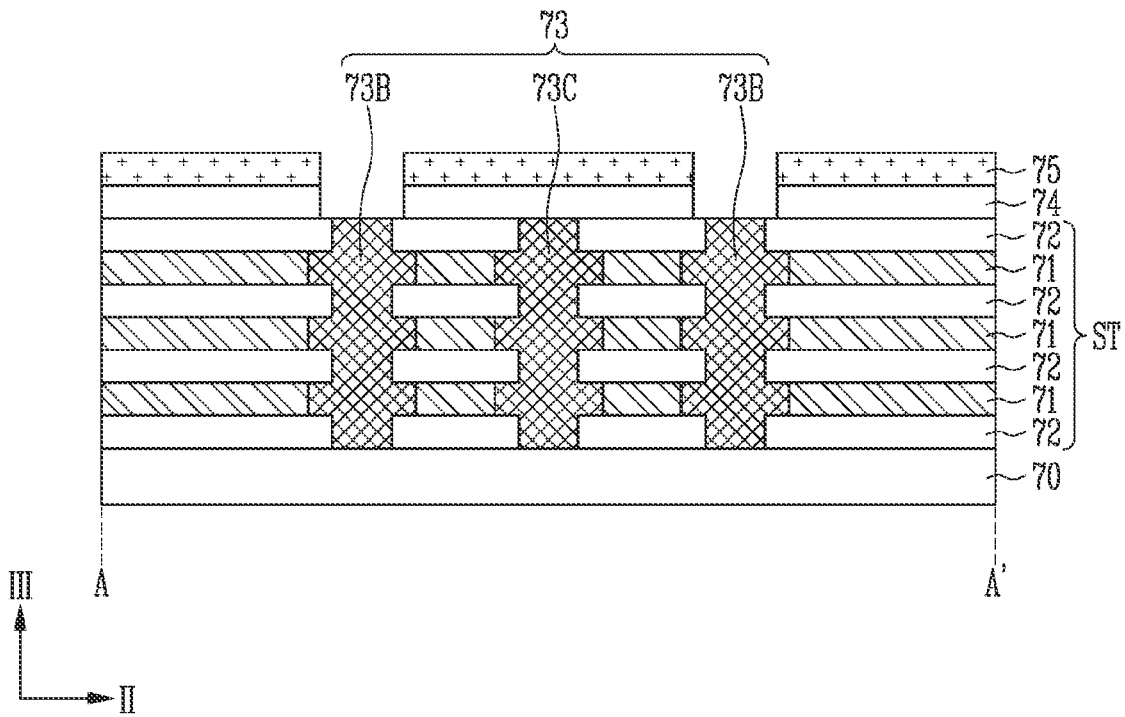
Figure 14C:
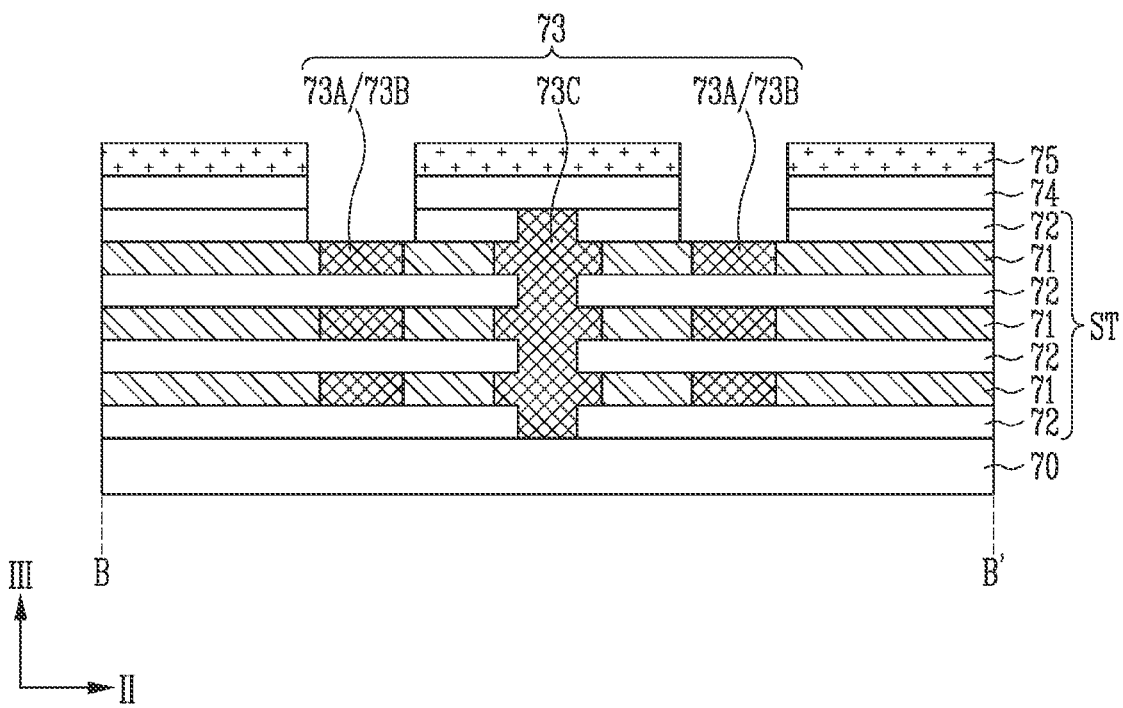
Figure 14D:
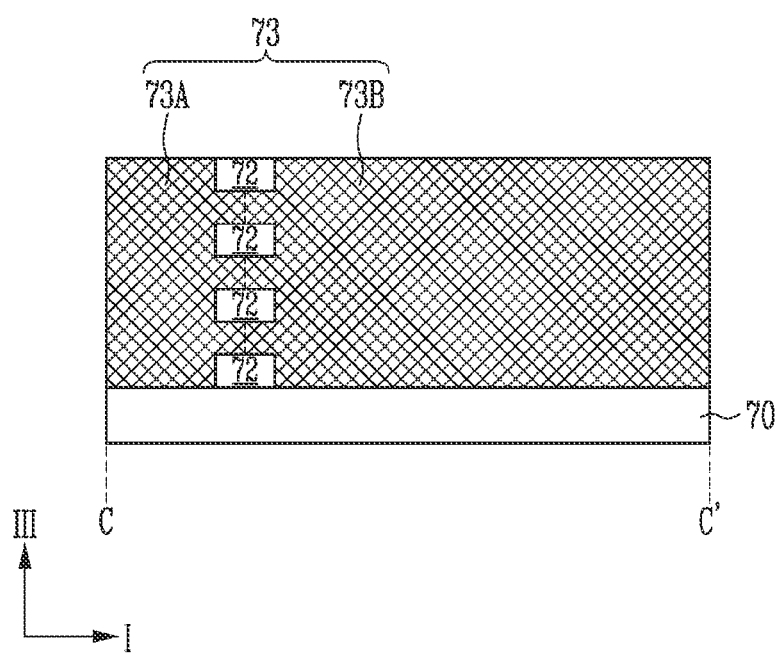
Figure 15B:
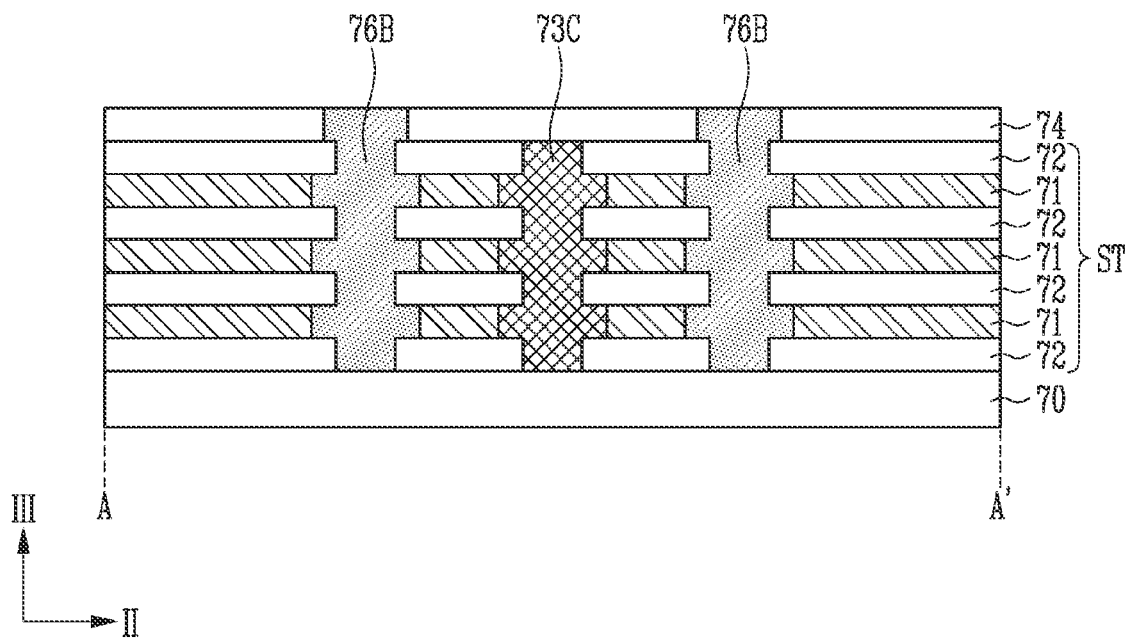
Figure 15C:
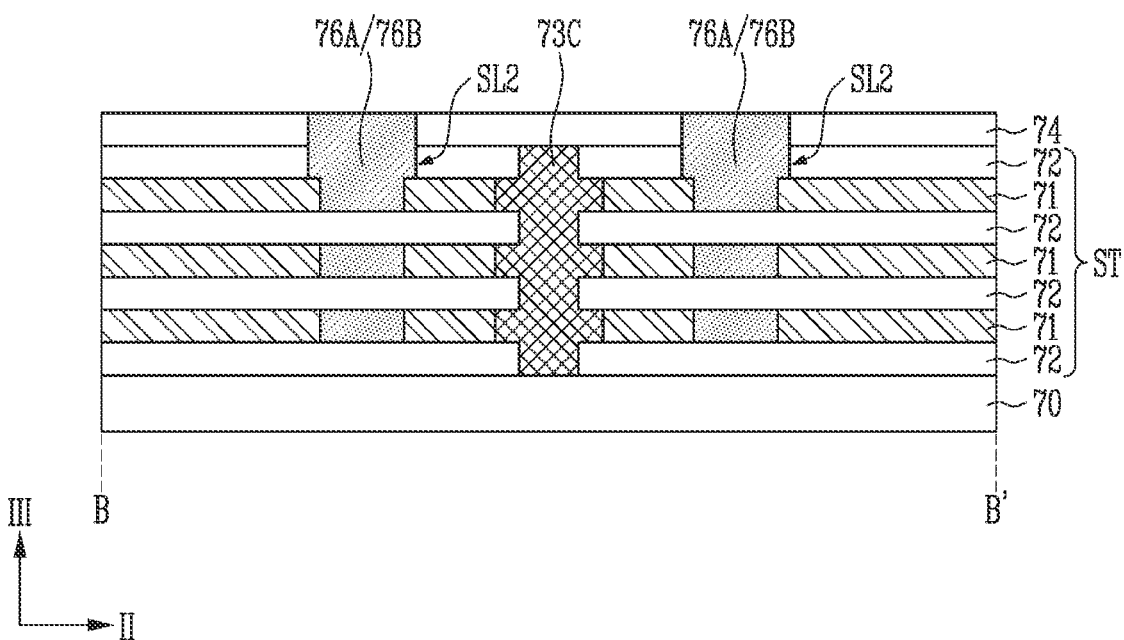
Figure 15D:
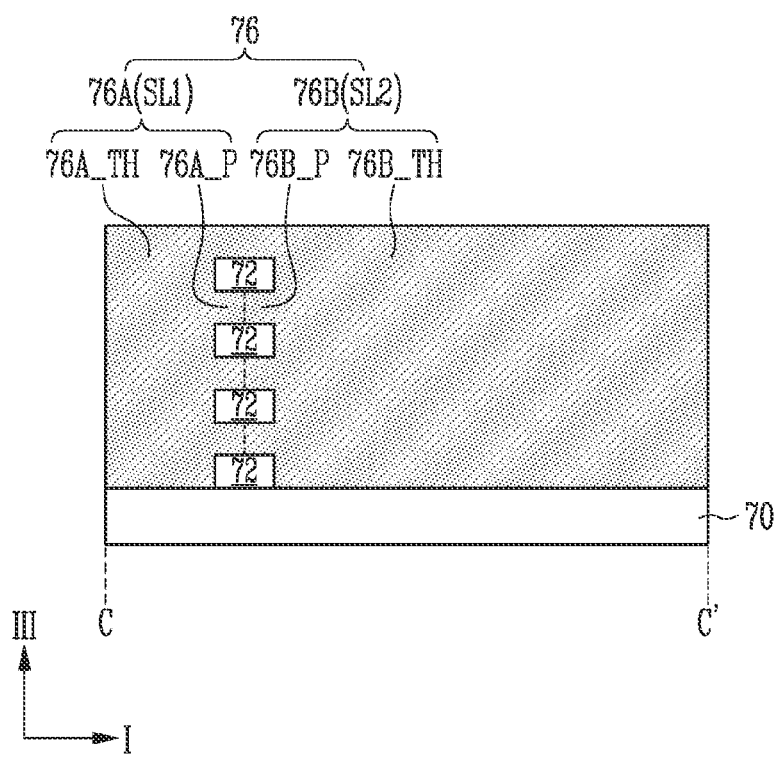
Figure 16A:
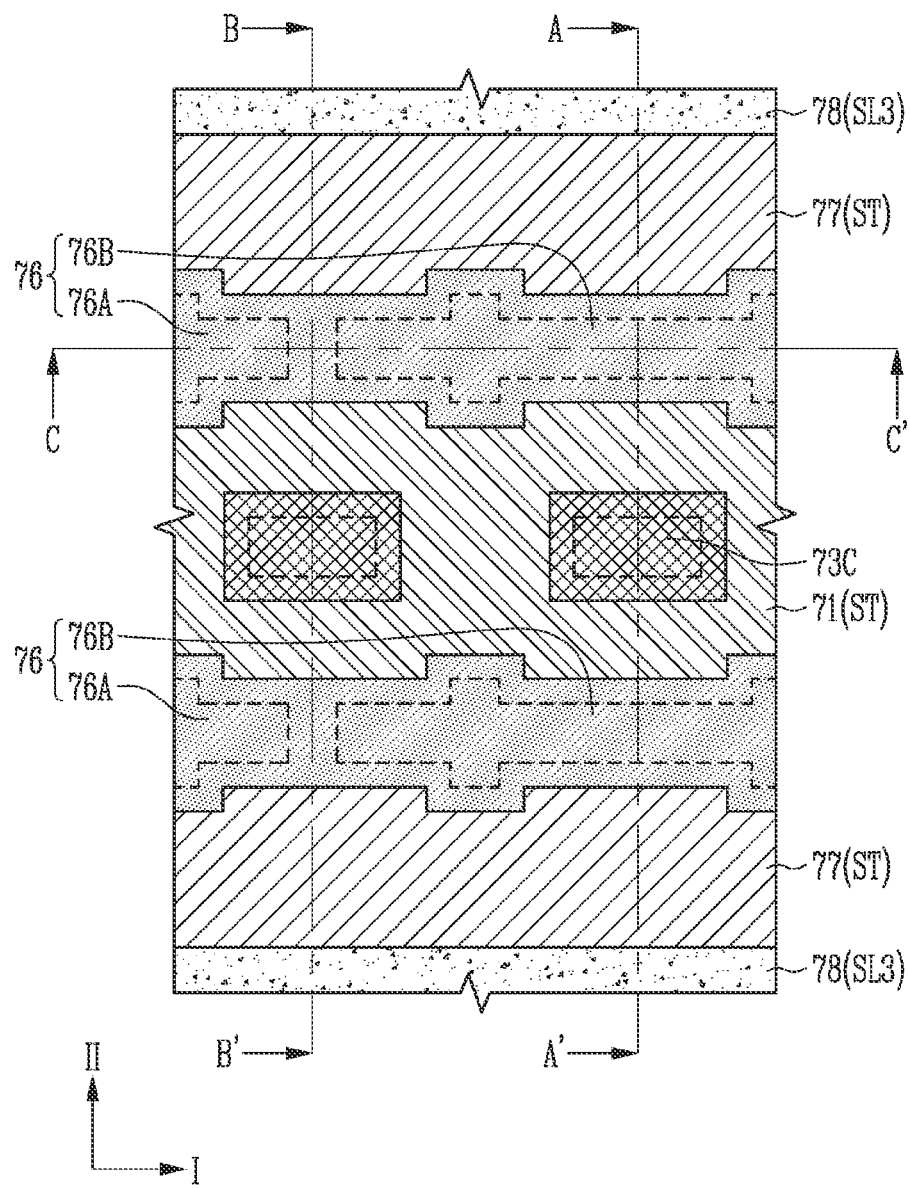
Figure 16B:
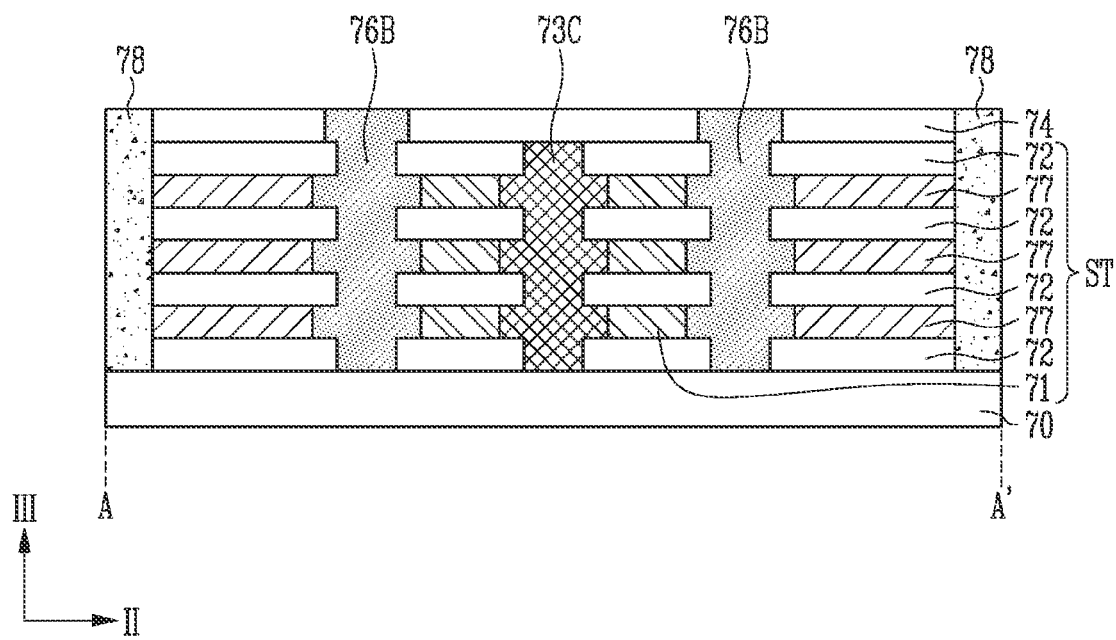
Figure 16C:
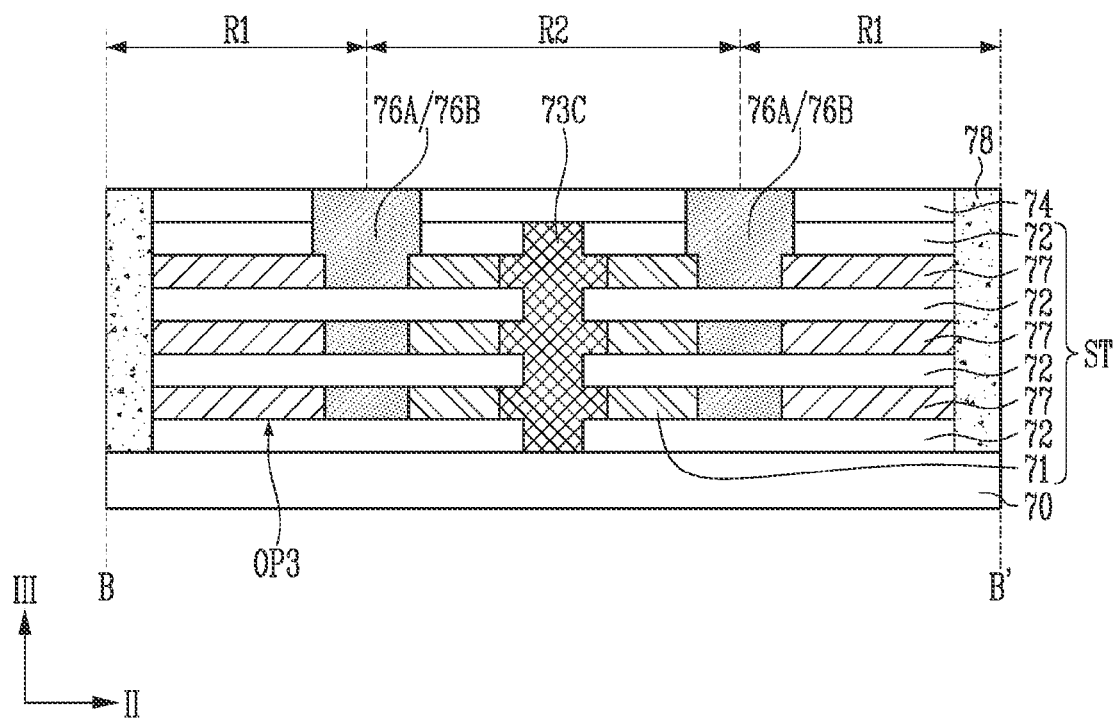
Figure 16D:
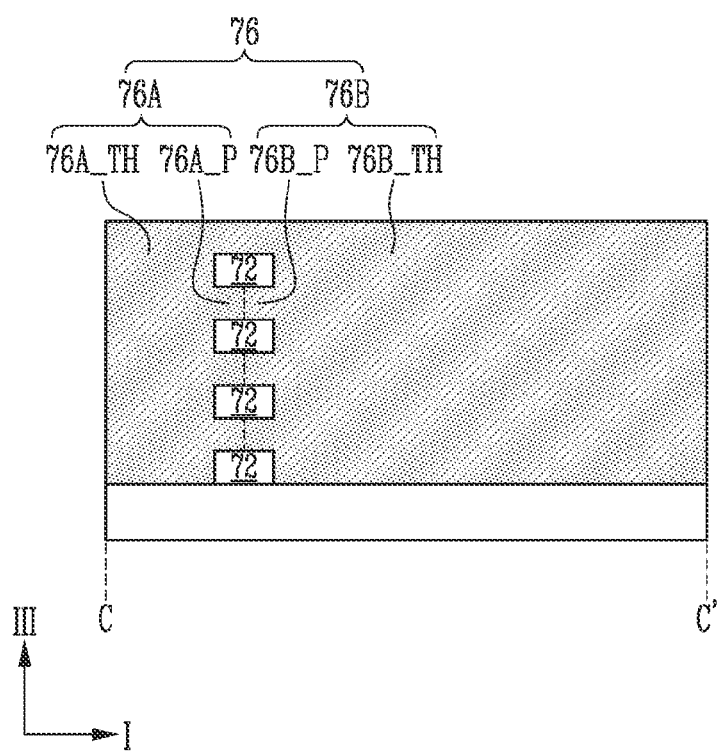

FIGS. 5A and 5B are layout views illustrating the structure of a semiconductor device according to an embodiment of the present disclosure.

Referring to FIGS. 5A and 5B, the semiconductor device may include a base 40, a circuit C, a first interlayer insulating layer 45, a source layer 30, the stacked structure ST, a second interlayer insulating layer 37, a channel structure 34, a contact plug 36, a first interconnection structure 35, a second interconnection structure 44, a discharge contact plug 46, and a third interconnection structure 38. In FIG. 5A, a cell region where memory cells are located may be shown and in FIG. 5B, a contact region where pads for applying a bias to conductive layers 33 are located may be shown.

The base 40 may be a substrate, or a semiconductor substrate. The first interlayer insulating layer 45 or the second interlayer insulating layer 37 may include an insulating material such as oxides. The stacked structure ST may include insulating layers 32 stacked on each other, and the sacrificial layers 31 and the conductive layers 33 interposed between the insulating layers 32. The conductive layers 33 may be electrically connected to, or may be the same as the conductive layers 13 as described above with reference to FIGS. 2A to 2E or the conductive layers 23 as described above with reference to FIGS. 3A to 3E.

Referring to FIG. 5A, the channel structure 34 may pass through the stacked structure ST and be coupled between the source layer 30 and the first interconnection structure 35. The first interconnection structure 35 may include wires, contact plugs, and the like. The first interconnection structure 35 may include bit lines. The channel structure 34 may include a channel layer 34B and may further include a memory layer 34A or a gap-filling layer 34C. The channel layer 34B may refer to a region where a channel of a memory cell, a select transistor, and the like is formed, and may include a semiconductor material such as polysilicon, or a nanostructure. The memory layer 34A may include a floating gate, a charge trapping material, polysilicon, a nitride, a variable resistance material, a phase change material, a nanostructure, or the like. The gap-filling layer 34C may include an oxide. A memory cell, a select transistor, and the like may be located at intersections between the channel structure 34 and the conductive layers 33.

Referring to FIG. 5B, the circuit C may be located on the base 40. The circuit C may be a peripheral circuit C for driving a cell array. The circuit C may include a transistor TR, a capacitor, a register, an inductor, an amplifier, a logic circuit, and the like. The transistor TR may include a gate insulating layer 42, a gate electrode 43 and a junction 41. The second interconnection structure 44 may be electrically connected to the circuit C. The second interconnection structure 44 may include wires, contact plugs, and the like, and may be electrically connected to the junction 41 or the gate electrode 43. The discharge contact plug 46 may pass through the source layer 30 and be electrically connected to the second interconnection structure 44. The discharge contact plug 46 may be provided so as to discharge charges in the source layer 30 during manufacturing processes. The discharge contact plug 46 may provide an electrical connection between the contact plug 36 and the circuit C. In some embodiments, the circuit C may include the second interconnection structure 44 and the transistor TR. In other embodiments, the circuit C may include the transistor TR.

The contact plug 36 may be electrically connected to the circuit through the discharge contact plug 46. The contact plug 36 may be electrically connected to the transistor TR through the discharge contact plug 46 and the second interconnection structure 44. The contact plug 36 may be the contact plug 16 as described above with reference to FIGS. 2A to 2E, or the contact plug 26 as described above with reference to FIGS. 3A to 3E.

The third interconnection structure 38 may be located above the stacked structure ST and formed in the second interlayer insulating layer 37. The third interconnection structure 38 may include wires, contact plugs, and the like and be electrically connected to the contact plug 36.

According to the above-described structures, the circuit may be located under the stacked structure ST including the cell array. The source layer 30 may be located between the circuit and the stacked structure ST. In addition, by using the contact plug 36 passing through the stacked structure ST, an electrical connection may be provided with respect to the circuit provided under the stacked structure ST.

FIGS. 6A to 6D, FIGS. 7A to 7D, FIGS. 8A to 8D, FIGS. 9A to 9D, and FIGS. 10A to 10D are diagrams illustrating a manufacturing method of a semiconductor device according to an embodiment of the present disclosure. FIGS. 6A to 10A are layout views, FIGS. 6B to 10B are cross-sectional views along A-A', FIGS. 6C to 10C are cross-sectional views along B-B', and FIGS. 6D to 10D are cross-sectional views along C-C'. In the following description, description of certain elements that are discussed above is omitted for the sake of brevity.

Referring to FIGS. 6A to 6D, the stacked structure ST may be formed on a source structure 50. The source structure 50 may include a source layer and a sacrificial layer for forming the source layer. The source structure 50 may be formed on a lower structure. For example, the source structure 50 may be located on a substrate including a circuit, and the stacked structure ST may be formed after a discharge contact plug passing through the source structure 50 is formed. The stacked structure ST may include sacrificial layers 51 and insulating layers 52 stacked alternately with each other. The sacrificial layers 51 may include a material having a high etch selectivity with respect to the insulating layers 52. For example, the sacrificial layers 51 may include a sacrificial material such as nitrides and the insulating layers 52 may include an insulating material such as oxides.

Subsequently, a first slit SL1 and a second slit SL2 may be formed through the stacked structure ST. The second slit SL2 may be spaced apart from the first slit SL1. The first slit SL1 and the second slit SL2 may neighbor each other in the first direction I. The first slit SL1 and the second slit SL2 may have enough depth to expose the source structure 50. A distance W1 between the first slit SL1 and the second slit SL2 neighboring each other in the first direction I may be smaller than a distance W2 between adjacent first slits SL1 in the second direction II.

For example, when the first slit SL1 and the second slit SL2 are formed, a slit may be further formed. For example, a slit may be additionally formed so as to form the fourth slit structure 19 as described with reference to FIG. 4A. In addition, each of the first and second slits SL1 and SL2 may have upper and lower parts with a constant width, or may decrease in width toward the source structure 50.

Referring to FIGS. 7A to 7D, openings OP1 and OP2 coupling the first slit SL1 and the second slit SL2 to each other may be formed. By partially etching the sacrificial layers 51 exposed through the first slit SL1, the first openings OP1 may be formed. The first openings OP1 may be coupled to the first slit SL1. By partially etching the sacrificial layers 51 exposed through the second slit SL2, the second openings OP2 may be formed. The second openings OP2 may be coupled to the second slit SL2. The second openings OP2 may be formed when the first openings OP1 are formed.

The first opening OP1 and the second opening OP2 located at the same level may be coupled to each other between the first slit SL1 and the second slit SL2. The first slit SL1 and the second slit SL2 may be coupled to each other through the first and second openings OP1 and OP2. However, since adjacent first slits SL1 in the second direction II are sufficiently spaced apart from each other, these first slits SL1 might not be coupled to each other through the first openings OP1.

Since the first and second openings OP1 and OP2 are formed by selectively etching the sacrificial layers 51, the insulating layers 52 formed between the first slit SL1 and the second slit SL2 neighboring each other in the first direction I may remain without being etched. Therefore, the first and second openings OP1 and OP2 and the insulating layers 52 may be alternately stacked between the first slit SL1 and the second slit SL2.

Referring to FIGS. 8A to 8D, a slit structure 53 may be formed in the first slit SL1, the second slit SL2, the first openings OP1 and the second openings OP2. The slit structure 53 may be a slit insulating layer. The slit structure 53 may include a first slit structure 53A and a second slit structure 53B.

The first slit structure 53A may include a first through portion 53A_TH formed in the first slit SL1 and first protrusions 53A_P formed in the first openings OP1. The second slit structure 53B may include a second through portion 53B_TH formed in the second slit SL2 and second protrusions 53B_P formed in the second openings OP2. The first protrusion 53A_P and the second protrusion 53B_P located at the same level may be coupled to each other. The slit structure 53 formed in the first slit SL1, the second slit SL2, the first openings OP1 and the second openings OP2 which are coupled to each other may be formed as a single layer. The protrusions 53A_P and 53B_P may be stacked alternately with the insulating layers 52 between the first through portion 53A_TH and the second through portion 53B_TH neighboring each other in the first direction I.

Referring to FIGS. 9A to 9D, a third slit SL3 may be formed at one side of the slit structure 53. One side of the slit structure 53 may be the first region R1 and the other side thereof may be the second region R2. The second region R2 may be defined between adjacent slit structures SLS in the second direction II. The third slit SL3 may be formed through the first region R1 of the stacked structure ST. The third slit SL3 may be adjacent to the first slit SL1 and the second slit SL2 in the second direction II and extend in the first direction I. The third slit SL3 may be deep enough to expose the entirety of the sacrificial layers 51.

Subsequently, third slit openings OP3 may be formed by selectively removing the sacrificial layers 51 through the third slit SL3. An etch composition introduced through the third slit SL3 may selectively etch the sacrificial layers 51 in the first region R1. Since the sacrificial layers 51 in the second region R2 are protected by the slit structure 53, the sacrificial layers 51 may remain without being etched. The slit structure 53 may serve as an isolation structure for separating the sacrificial layers 51 in the first region R1 and the sacrificial layers 51 in the second region R2 from each other. In addition, when the sacrificial layers 51 are removed, the insulating layers 52 in the first region R1 may be effectively supported by the slit structure 53. Particularly, the insulating layers 52 may be effectively supported by the protrusions 53A_P and 53B_P.

Subsequently, conductive layers 55 may be formed in the third openings. The conductive layers 55 may include metal such as tungsten. Subsequently, a slit structure 56 may be formed in the third slit SL3. The slit structure 56 may be a slit insulating layer. Alternatively, the stacked structure ST may include a conductive layer electrically connected to the source structure 50 and an insulating spacer interposed between the conductive layer and the stacked structure ST.

Referring to FIGS. 10A to 10D, a contact plug 57 may be formed on the other side of the slit structure 53. After a contact plug is formed through the second region R2 of the stacked structure ST, the contact hole may be filled with a conductive material to thereby form the contact plug 57. The contact plug 57 may pass through the stacked structure ST and may be electrically connected to a circuit (not shown) located under the source structure 50 through a discharge contact plug, an interconnection structure, and the like. The contact plug 57 and the conductive layers 55 may be insulated from each other by the sacrificial layers 51 remaining in the second region R2.

Though not shown in FIGS. 10A to 10D, a process for forming a channel structure may be further performed. For example, before the first slit SL1 and the second slit SL2 are formed, the channel structure CH may be formed. In addition, a process of replacing the sacrificial layer included in the source structure 50 with a source layer may be further performed. For example, the sacrificial layer included in the source structure may be replaced by a source layer through the third slit SL3. The source layer replacement process may be performed before or after the conductive layer 55 replacement process.

According to the above-described manufacturing method, the first slit SL1 and the second slit SL2 may be coupled only at a predetermined level by selectively etching the sacrificial layers 51 through the first slit SL1 and the second slit SL2. In addition, the slit structure 53 that separates one side from the other side only at a predetermined level may be formed by forming an insulating material in the first slit SL1, the second slit SL2 and the openings OP1 and OP2 coupled to each other. Therefore, the slit structure 53 having a high aspect ratio and a stabilized structure may be formed.

FIGS. 11A to 11D, FIGS. 12A to 12D, FIGS. 13A to 13D, FIGS. 14A to 14D, FIGS. 15A to 15D, and FIGS. 16A to 16D are diagrams illustrating a manufacturing method of a semiconductor device according to an embodiment of the present disclosure. FIGS. 11A to 16A are layout views, FIGS. 11B to 16B are cross-sectional views along A-A', FIGS. 11C to 16C are cross-sectional views along B-B', and FIGS. 11D to 16D are cross-sectional views along C-C'. In the following description, description of certain elements that are discussed above is omitted for the sake of brevity.

Referring to FIGS. 11A to 11D, the stacked structure ST may be formed on a source structure 70. The stacked structure ST may include sacrificial layers 71 and insulating layers 72 stacked alternately with each other. The sacrificial layers 71 may include a sacrificial material and the insulating layers 72 may include an insulating material.

Subsequently, the first slit SL1, the second slit SL2, and a contact hole CTH may be formed through the stacked structure ST. The first slit SL1 and the second slit SL2 may neighbor each other in the first direction I. The contact hole CTH may be located between adjacent first slits SL1 in the second direction II, or between adjacent second slits SL2 in the second direction II. Alternatively, however, the stacked structure ST may remain between the first slit SL1 and the second slit SL2 neighboring each other in the first direction I, and the contact hole CTH may be located at a position corresponding to the remaining portion.

The first slit SL1 may have a length in the first direction I and a width in the second direction II. The first slit SL1 may have a varying width depending on the area thereof. The first slit SL1 may include a first portion corresponding to the contact hole CTH and a second portion not corresponding thereto. The second portion of the first slit SL1 may have a greater width than the first portion thereof. Similarly to the first slit SL1, the second slit SL2 may have a varying width depending on the area thereof.

The contact hole CTH may have a circular, elliptical, rectangular, or polygonal plane. The contact hole CTH may have a plane with a shorter length in the first direction I than the first slit SL1 or the second slit SL2. The first slit SL1 or the second slit SL2 may be an opening having a linear shape and the contact hole CTH may be an opening having a hole shape.

The first slit SL1, the second slit SL2 and the contact hole CTH may be formed at the same time, or through separate processes. For example, when the first slit SL1 and the second slit SL2 are formed, the contact hole CTH may be formed. In this example, the first slit SL1, the second slit SL2 and the contact hole CTH may substantially the same depth.

For example, when the first slit SL1, the second slit SL2, or the contact hole CTH is formed, a slit may be further formed. For example, a slit may be additionally formed for forming the fourth slit structure 29 as described with reference to FIG. 4B.

Referring to FIGS. 12A to 12D, the first openings OP1 may be formed by etching the sacrificial layers 51 exposed through the first slit SL1. By etching the sacrificial layers 51 exposed through the second slit SL2, the second openings OP2 may be formed. The first slit SL1 and the second slit SL2 may be coupled to each other through the first openings OP1 and the second openings OP2. By etching the sacrificial layers 51 exposed through the contact hole CTH, the third openings OP3 may be formed. The third openings OP3 may be coupled to the contact hole CTH. The third openings OP3 may be separated from the first and second openings OP1 and OP2. The first opening OP1, the second opening OP2 and the third openings OP3 may be formed at the same time, or through separate processes.

Referring to FIGS. 13A to 13D, a conductive material 73 may be formed to fill the first slit SL1, the second slit SL2, the contact hole CTH, the first openings OP1, the second openings OP2 and the third openings OP3. The conductive material 73 may include metal such as tungsten.

As a result, a first conductive layer 73A may be formed in the first slit SL1 and the first openings OP1, a second conductive layer 73B may be formed in the second slit SL2 and the second openings OP2, and a third conductive layer 73C may be formed in the contact hole CTH and the third openings OP3. The third conductive layer 73C may include a through portion 73C_TH formed in the contact hole CTH and protrusions 73C_P formed in the third openings OP3. The third conductive layer 73C may be a contact plug. The first conductive layer 73A and the second conductive layer 73B may be coupled to each other and formed as a single layer.

Referring to FIGS. 14A to 14D, an insulating layer 74 and a mask pattern 75 may be formed on the stacked structure ST. The mask pattern 75 may serve as an etch barrier for selectively removing the first conductive layer 73A and the second conductive layer 73B. The mask pattern 75 may include openings located at positions corresponding to the first slit SL1 and the second slit SL2 and may cover the third slit SL3.

Subsequently, the insulating layer 74 and the stacked structure ST may be etched using the mask pattern 75 as an etch barrier to expose the first conductive layer 73A and the second conductive layer 73B. As a result, the third conductive layer 73C might not be exposed, while the first conductive layer 73A and the second conductive layer 73B may be selectively exposed.

Referring to FIGS. 15A to 15D, the first conductive layer 73A and the second conductive layer 73B may be selectively removed. The first conductive layer 73A and the second conductive layer 73B may be selectively etched using the mask pattern 75 as an etch barrier. As a result, the first slit SL1, the second slit SL2, the first openings OP1 and the second openings OP2 may be opened again.

Subsequently, a slit structure 76 may be formed in the first slit SL1, the second slit SL2, the first openings OP1 and the second openings OP2. The slit structure 76 may be a slit insulating layer. The slit structure 76 may include a first slit structure 76A and a second slit structure 76B.

The first slit structure 76A may include a first through portion 76A_TH formed in the first slit SL1 and first protrusions 76A_P formed in the first openings OP1. The second slit structure 76B may include a second through portion 76B_TH formed in the second slit SL2 and second protrusions 76B_P formed in the second openings OP2. The first protrusion 76A_P and the second protrusion 76B_P located at the same level may be coupled to each other.

Referring to FIGS. 16A to 16D, the third slit SL3 may be formed at one side of the slit structure 76. One side of the slit structure 76 may be the first region R1 and the other side thereof may be the second region R2. The third slit SL3 may be formed through the first region R1 of the stacked structure ST.

Subsequently, the third slit openings OP3 may be formed by selectively removing the sacrificial layers 71 through the third slit SL3. The sacrificial layers 51 in the first region R1 may be selectively etched, whereas the sacrificial layers 51 in the second region R2 may remain without being etched. Subsequently, conductive layers 77 may be formed in the third openings OP3. Subsequently, a slit structure 78 may be formed in the third slit SL3. The slit structure 78 may be a slit insulating layer.

According to the above-described manufacturing method, the slit structure 76 for separating the first region R1 and the second region R2 from each other at a level corresponding to the conductive layers 77 may be formed. Therefore, the slit structure 76 having a high aspect ratio and a stabilized structure may be formed.

Figure 17:
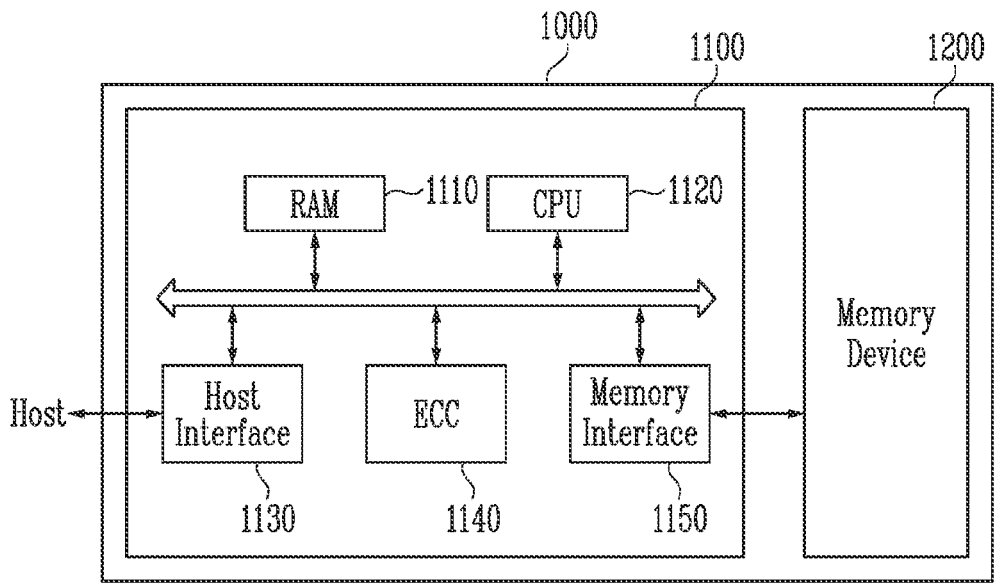
FIG. 17 is a block diagram illustrating the configuration of a memory system according to an embodiment of the present disclosure.

FIG. 17 is a block diagram illustrating the configuration of a memory system 1000 according to an embodiment of the present disclosure.

Referring FIG. 17, the memory system 1000 according to an embodiment of the present disclosure may include a memory device 1200 and a controller 1100.

The memory device 1200 may be used to store various types of data such as text, graphics, and software codes. The memory device 1200 may be a non-volatile memory device. In addition, the memory device 1200 may include the above configuration described with reference to FIGS. 1 to 16D, and may be manufactured by the method described with reference to FIGS. 1 to 16D. Since the memory device 1200 is configured and manufactured in the same manner as described above, a detailed description thereof will be omitted.

The controller 1100 may be coupled to a host and the memory device 1200 and configured to access the memory device 1200 in response to a request from the host. For example, the controller 1100 may control read, write, erase, and background operations of the memory device 1200.

The controller 1100 may include a random access memory (RAM) 1110, a central processing unit (CPU) 1120, a host interface 1130, an error correction code (ECC) circuit 1140, and a memory interface 1150.

The RAM 1110 may serve as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), or the like.

The CPU 1120 may control the overall operation of the controller 1100. For example, the CPU 1120 may operate firmware such as a flash translation layer (FTL) stored in the RAM 1110.

The host interface 1130 may interface with the host. For example, the controller 1100 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, and an integrated drive electronics (IDE) protocol, a private protocol, and the like.

The ECC circuit 1140 may use an error correction code (ECC) to detect and correct errors in data read from the memory device 1200.

The memory interface 1150 may interface with the memory device 1200. For example, the memory interface 1150 may include a NAND interface or a NOR interface.

For reference, the controller 1100 may further include a buffer memory (not shown) for temporarily storing data. The buffer memory may be used to temporarily store data to be transferred from the host interface 1130 to an external device, or data to be transferred from the memory interface 1150 to the memory device 1200. In addition, the controller 1100 may further include a ROM that stores code data for interfacing with the host.

Since the memory system 1000 according to the embodiment includes the memory device 1200 having improved integration density and characteristics, the memory system 1000 may also have improved integration density and characteristics accordingly.

Figure 18:
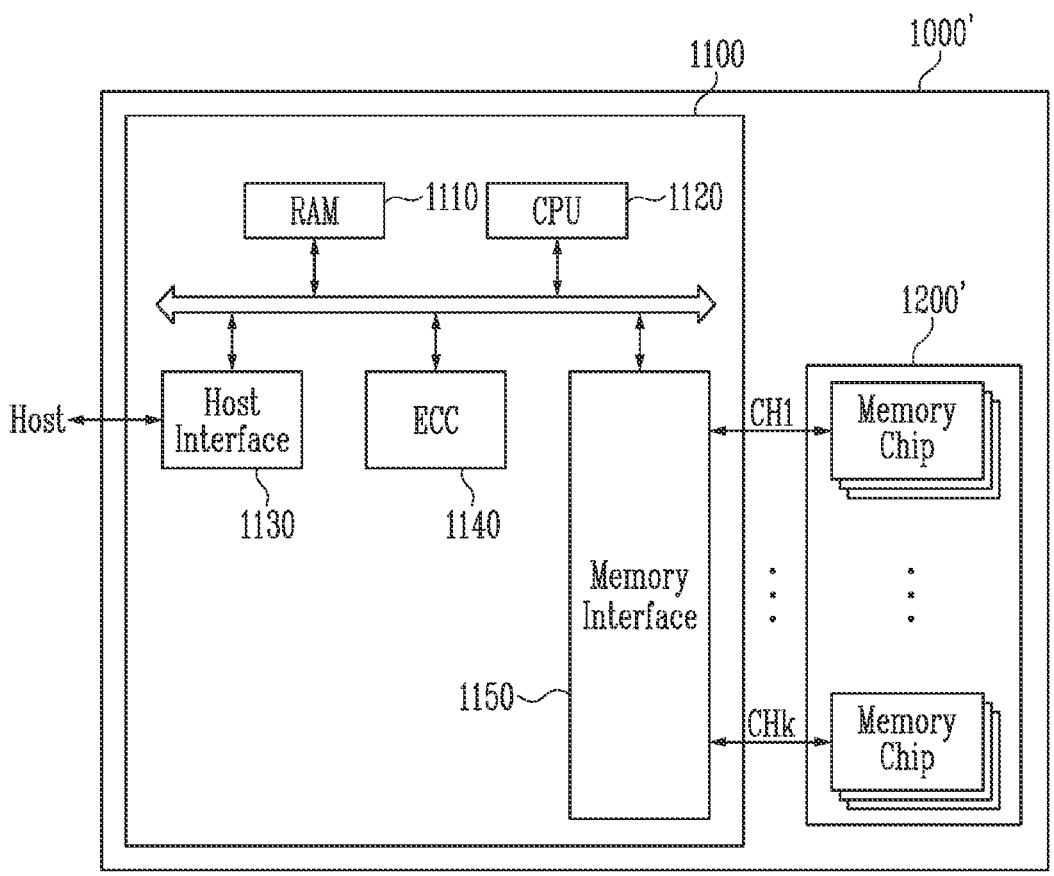
FIG. 18 is a block diagram illustrating the configuration of a memory system according to an embodiment of the present disclosure.

FIG. 18 is a block diagram illustrating the configuration of a memory system 1000' according to an embodiment of the present disclosure. Hereinafter, any repetitive detailed description of components already mentioned above will be omitted.

Referring to FIG. 18, the memory system 1000' according to an embodiment may include a memory device 1200' and the controller 1100. The controller 1100 may include a RAM 1110, a CPU 1120, a host interface 1130, an ECC circuit 1140 and a memory interface 1150.

The memory device 1200' may be a non-volatile memory device. In addition, the memory device 1200' may include the above configuration as described with reference to FIGS. 1 to 16D, and may be manufactured by the method described with reference to FIGS. 1 to 16D. Since the memory device 1200' is configured and manufactured in the same manner as described above, a detailed description thereof will be omitted.

Furthermore, the memory device 1200' may be a multi-chip package including a plurality of memory chips. The plurality of memory chips may be divided into a plurality of groups, which may communicate with the controller 1100 through first to kth channels CH1 to CHk, respectively. In addition, memory chips, included in a single group, may be suitable for communicating with the controller 1100 through a common channel. For reference, the memory system 1000' may be modified such that each memory chip may be coupled to a corresponding single channel.

As described above, since the memory system 1000' according to the embodiment includes the memory device 1200' having improved integration and characteristics, the integration and characteristics of the memory system 1000' may also be improved. In particular, since the memory device 1200' is formed into a multi-chip package, data storage capacity and driving speed of the memory system 1000' may be further increased.

Figure 19:
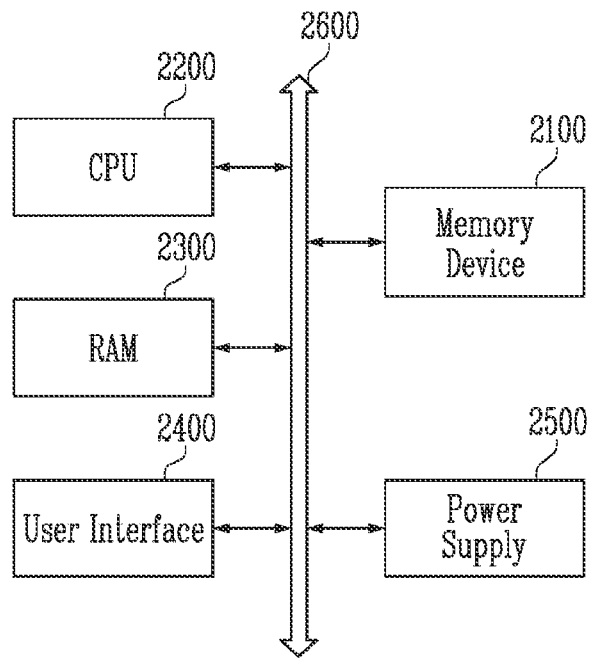
FIG. 19 is a block diagram showing the configuration of a computing system according to an embodiment of the present disclosure.

FIG. 19 is a block diagram showing the configuration of a computing system 2000 according to an embodiment of the present disclosure. In the following description, description of certain elements that are discussed above is omitted for the sake of brevity.

Referring to FIG. 19, the computing system 2000 according to an embodiment of the present disclosure may include a memory device 2100, a CPU 2200, a RAM 2300, a user interface 2400, a power supply 2500, a system bus 2600, and so forth.

The memory device 2100 may store data provided via the user interface 2400, data processed by the CPU 2200, etc. The memory device 2100 may be electrically connected to the CPU 2200, the RAM 2300, the user interface 2400, and the power supply 2500 by the system bus 2600. For example, the memory device 2100 may be coupled to the system bus 2600 via a controller (not shown), or directly to the system bus 2600. When the memory device 2100 is directly coupled to the system bus 2600, functions of the controller may be performed by the CPU 2200 and the RAM 2300.

The memory device 2100 may be a non-volatile memory. In addition, the memory device 2100 may include the above configuration as described with reference to FIGS. 1 to 16D, and may be manufactured by the method described with reference to FIGS. 1 to 16D. Since the memory device 2100 is configured and manufactured in the same manner as described above, a detailed description thereof will be omitted.

In addition, as described above with reference to FIG. 18, the memory device 2100 may be a multi-chip package composed of a plurality of memory chips.

The computing system 2000 having the above-mentioned configuration may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or the like.

As described above, since the computing system 2000 according to the embodiment includes the memory device 2100 having improved integration and characteristics, the characteristics of the computing system 2000 may also be improved.

Figure 20:
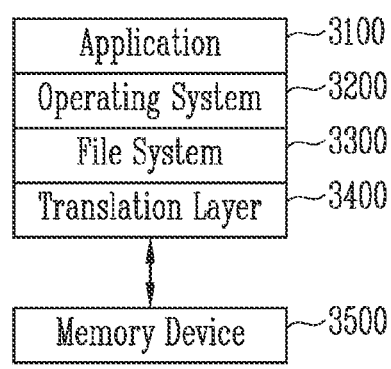
FIG. 20 is a block diagram illustrating a computing system according to an embodiment of the present disclosure.

FIG. 20 is a block diagram illustrating a computing system 3000 according to an embodiment.

As illustrated in FIG. 20, the computing system 3000 according to an embodiment may include a software layer that has an operating system 3200, an application 3100, a file system 3300, and a translation layer 3400. The computing system 3000 may include a hardware layer such as a memory device 3500.

The operating system 3200 may manage software and hardware resources of the computing system 3000. The operating system 3200 may control program execution of a central processing unit. The application 3100 may include various application programs executed by the computing system 3000. The application 3100 may be a utility executed by the operating system 3200.

The file system 3300 may refer to a logical structure configured to manage data and files present in the computing system 3000. The file system 3300 may organize files or data and store them in the memory device 3500 according to given rules. The file system 3300 may be determined depending on the operating system 3200 used in the computing system 3000. For example, when the operating system 3200 is a Microsoft Windows-based system, the file system 3300 may be a file allocation table (FAT) or an NT file system (NTFS). In addition, the operating system 3200 is a Unix/Linux system, the file system 3300 may be an extended file system (EXT), a Unix file system (UFS), a journaling file system (JFS), or the like.

FIG. 20 illustrates the operating system 3200, the application 3100, and the file system 3300 in separate blocks. However, the application 3100 and the file system 3300 may be included in the operating system 3200.

The translation layer 3400 may translate an address into a suitable form for the memory device 3500 in response to a request from the file system 3300. For example, the translation layer 3400 may translate a logic address, generated by the file system 3300, into a physical address of the memory device 3500. Mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. In addition, the memory device 3500 may include the above configuration as described with reference to FIGS. 1 to 16D, and may be manufactured by the method described with reference to FIGS. 1 to 16D. Since the memory device 3500 is configured and manufactured in the same manner as described above, a detailed description thereof will be omitted.

The computing system 3000 having the above-described configuration may be divided into an operating system layer that is operated in an upper layer region and a controller layer that is operated in a lower level region. The application 3100, the operating system 3200, and the file system 3300 may be included in the operating system layer, and may be driven by an operating memory of the computing system 3000. The translation layer 3400 may be included in the operating system layer or the controller layer.

As described above, since the computing system 3000 according to the embodiment includes the memory device 3500 having improved integration density and characteristics, characteristics of the computing system 3000 may also be improved.

In accordance with various embodiments of the disclosure, a semiconductor device having a stabilized structure and improved reliability may be provided.

What is claimed is:

1. A method of manufacturing a semiconductor device, the method comprising:
   forming a stacked structure including sacrificial layers and insulating layers stacked alternately with each other;
   forming a first slit passing through the stacked structure;
   forming a second slit passing through the stacked structure and spaced apart from the first slit;
   forming first openings coupling the first slit and the second slit to each other by etching sacrificial layers exposed through the first slit and the second slit;
   forming a slit structure in the first slit, the second slit, and the first openings;
   forming second openings by selectively removing the sacrificial layers located at one side of the slit structure; and
   forming conductive layers in the second openings.

2. The method of claim 1, wherein the slit structure includes a first through portion located in the first slit, a second through portion located in the second slit and protrusions located in the first openings, and the protrusions are stacked alternately with the insulating layers.

3. The method of claim 1, wherein the forming of the second openings comprises:
   forming a third slit located at the one side of the slit structure and passing through the stacked structure; and
   selectively etching the sacrificial layers through the third slit.

4. The method of claim 1, further comprising forming a contact plug located at another side of the slit structure and passing through the sacrificial layers and the insulating layers after forming the conductive layers.

5. The method of claim 4, further comprising forming a circuit on a base before forming the stacked structure,
   wherein the contact plug is electrically connected to the circuit.

6. The method of claim 1, further comprising:
   forming a contact hole passing through the stacked structure;
   forming third openings by etching sacrificial layers exposed through the contact hole;
   forming conductive layers in the first slit, the second slit, the first openings, the contact hole, and the third openings; and
   selectively removing the conductive layers from the first slit, the second slit, and the first openings.

7. The method of claim 6, wherein the contact hole is formed when the first slit and the second slit are formed.

8. The method of claim 6, wherein the selectively removing of the conductive layers comprises:
   forming a mask pattern on the stacked structure and the conductive layers to expose the first slit and the second slit; and
   etching the conductive layers exposed through the mask pattern.

9. The method of claim 6, wherein the forming of the conductive layers and the selectively removing of the conductive layers are performed before forming the slit structure.

* * * * *